(12) United States Patent
Kim et al.

(10) Patent No.: US 11,825,704 B2
(45) Date of Patent: Nov. 21, 2023

(54) DISPLAY APPARATUS HAVING FLOURINE AT INTERFACES OF SEMICONDUCTOR LAYER AND MANUFACTURING METHOD THEREOF

(71) Applicant: Samsung Display Co., Ltd., Yongin-Si (KR)

(72) Inventors: Moonsung Kim, Yongin-si (KR); Younggil Park, Yongin-si (KR); Jaebum Han, Yongin-si (KR); Sooim Jeong, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 28 days.

(21) Appl. No.: 17/331,606

(22) Filed: May 26, 2021

(65) Prior Publication Data

US 2022/0181416 A1 Jun. 9, 2022

(30) Foreign Application Priority Data

Dec. 4, 2020 (KR) .................. 10-2020-0168716

(51) Int. Cl.
*H10K 59/124* (2023.01)
*H10K 71/00* (2023.01)

(52) U.S. Cl.
CPC ........... *H10K 59/124* (2023.02); *H10K 71/00* (2023.02)

(58) Field of Classification Search
CPC ................. H01L 27/3258; H01L 51/56; H01L 2251/558; H01L 27/3262; H01L 27/3244; H01L 27/1218; H01L 27/1225; H01L 27/1262; H01L 27/1274; H01L 2227/323; H10K 59/124; H10K 71/00; H10K 2102/351; H10K 59/1213; H10K 59/12; H10K 59/1201; Y02P 70/50; Y02E 10/549

See application file for complete search history.

(56) References Cited

U.S. PATENT DOCUMENTS

| | | | | |
|---|---|---|---|---|
| 4,678,282 A | * | 7/1987 | Yaniv ................... | G09G 3/3659 257/55 |
| 6,022,646 A | * | 2/2000 | Kim ................... | G02F 1/133512 430/7 |
| 6,099,993 A | * | 8/2000 | Kim ....................... | G02B 5/201 430/7 |
| 6,737,672 B2 | | 5/2004 | Hara et al. | |
| 8,570,261 B2 | * | 10/2013 | Gu ..................... | G02F 1/133512 349/110 |

(Continued)

FOREIGN PATENT DOCUMENTS

| | | |
|---|---|---|
| JP | 6331052 B2 | 5/2018 |
| JP | 6702304 B2 | 6/2020 |

(Continued)

*Primary Examiner* — Caleb E Henry
(74) *Attorney, Agent, or Firm* — Innovation Counsel LLP

(57) ABSTRACT

An embodiment of a display apparatus includes a substrate, a buffer layer on the substrate, a thin film transistor including a semiconductor layer disposed on the buffer layer and including a silicon semiconductor, and a gate electrode insulated from the semiconductor layer, and an insulating layer covering the semiconductor layer, in which a concentration of fluorine at an interface between the semiconductor layer and the buffer layer is at least 10% of a concentration of the fluorine at the interface between the semiconductor layer and the insulating layer.

13 Claims, 19 Drawing Sheets

(56) References Cited

U.S. PATENT DOCUMENTS

| | | | |
|---|---|---|---|
| 9,214,508 B2 | 12/2015 | Cho et al. | |
| 9,786,845 B1 * | 10/2017 | Smith | H10K 71/20 |
| 10,005,263 B2 | 6/2018 | Jung et al. | |
| 10,312,375 B2 | 6/2019 | Ikeda et al. | |
| 2002/0004262 A1 * | 1/2002 | Asami | H01L 21/0262 |
| | | | 257/E29.294 |
| 2002/0173617 A1 * | 11/2002 | Yasuda | C07C 211/58 |
| | | | 528/424 |
| 2003/0082859 A1 * | 5/2003 | Ichijo | H01L 21/02672 |
| | | | 438/166 |
| 2007/0259521 A1 * | 11/2007 | Oh | G02F 1/136227 |
| | | | 257/E21.582 |
| 2009/0114915 A1 * | 5/2009 | Toriumi | H01L 29/78603 |
| | | | 438/479 |
| 2015/0287799 A1 * | 10/2015 | Murashige | G02F 1/133514 |
| | | | 257/43 |
| 2016/0254334 A1 * | 9/2016 | Yang | H01L 21/477 |
| | | | 257/40 |
| 2017/0162713 A1 | 6/2017 | Matsumoto | |

FOREIGN PATENT DOCUMENTS

| | | |
|---|---|---|
| KR | 10-0829466 B1 | 5/2008 |
| KR | 10-2016-0104790 A | 9/2016 |
| KR | 10-1854497 B1 | 6/2018 |

* cited by examiner

DISPLAY APPARATUS HAVING FLOURINE AT INTERFACES OF SEMICONDUCTOR LAYER AND MANUFACTURING METHOD THEREOF

CROSS-REFERENCE TO RELATED APPLICATION

This application is based on and claims priority under 35 U.S.C. § 119 to Korean Patent Application No. 10-2020-0168716, filed on Dec. 4, 2020, in the Korean Intellectual Property Office, the disclosure of which is incorporated by reference herein in its entirety.

BACKGROUND

1. Field

The present disclosure relates to display apparatuses and methods of manufacturing the display apparatuses.

2. Description of the Related Art

Recently, display apparatuses have been used in various ways. In particular, as the thickness and weight of a display apparatus gradually decrease, the scope of use thereof is expanding. Among the display apparatuses, a thin flat-panel flexible display apparatus that can be carried is in the spotlight. These flexible display apparatuses are generally light in weight and have strong shock resistance properties, and can be folded or rolled to store, thus providing advantages of excellent portability.

SUMMARY

According to one or more embodiments, a display apparatus includes a substrate, a buffer layer on the substrate, a thin film transistor including a semiconductor layer disposed on the buffer layer and including a silicon semiconductor, and a gate electrode insulated from the semiconductor layer, and an insulating layer covering the semiconductor layer, in which a concentration of fluorine at a first interface between the semiconductor layer and the buffer layer is at least 10% of a concentration of the fluorine at a second interface between the semiconductor layer and the insulating layer.

In the present embodiment, a minimum concentration of the fluorine in the semiconductor layer may be no more than $1 \times 10^{20}$ atom/cm$^3$.

In the present embodiment, a concentration of the fluorine at the first interface between the first semiconductor layer and the buffer layer may be greater than a minimum concentration of the fluorine of the first semiconductor layer.

In the present embodiment, the buffer layer may include a first buffer layer on the substrate, a second buffer layer on the first buffer layer, and a third buffer layer on the second buffer layer, and a hydrogen concentration of the first buffer layer may be greater than a hydrogen concentration of the second buffer layer.

In the present embodiment, a hydrogen concentration of the first buffer layer may be within the range and including $1.1 \times 10^{22}$ atom/cm$^3$ to $2.0 \times 10^{22}$ atom/cm$^3$, and a hydrogen concentration of the second buffer layer may be within the range an including $7.0 \times 10^{21}$ atom/cm$^3$ to $1.0 \times 10^{22}$ atom/cm$^3$.

In the present embodiment, a film density of the first buffer layer may be greater than a film density of the second buffer layer.

In the present embodiment, the display apparatus may further include a barrier layer disposed between the substrate and the buffer layer and including a first layer on the substrate, a second layer on the first layer, and a third layer on the second layer.

In the present embodiment, the second layer may have a surface roughness within the range and including 3 nm to 5 nm.

In the present embodiment, a hydrogen concentration of the second layer may be greater than a hydrogen concentration of the first layer.

In the present embodiment, the first layer may have a first thickness in a direction perpendicular to the substrate, and the third layer may have a second thickness in a direction perpendicular to the substrate.

In the present embodiment, the first thickness and the second thickness each may be within the range and including 50 Å to 300 Å.

In the present embodiment, the display apparatus may further include a second insulating layer covering the gate electrode, and a second thin film transistor disposed on the second insulating layer and including a second semiconductor layer that includes an oxide semiconductor, and a second gate electrode that is insulated from the second semiconductor layer.

In the present embodiment, the gate electrode and the second gate electrode may be arranged on layers different from each other.

According to one or more embodiments, a method of manufacturing a display apparatus includes forming an amorphous silicon layer on a buffer layer, injecting fluorine into the amorphous silicon layer, forming a semiconductor layer by crystallizing the amorphous silicon layer into a polycrystalline silicon layer after injecting the fluorine, and forming an insulating layer on the semiconductor layer, in which a concentration of the fluorine at a first interface between the semiconductor layer and the buffer layer is at least 10% of a concentration of the fluorine at a second interface between the semiconductor layer and the insulating layer.

In the present embodiment, a concentration of the fluorine at the first interface between the first semiconductor layer and the buffer layer may be greater than a minimum concentration of the fluorine of the first semiconductor layer.

In the present embodiment, the method may further include, before the forming of the amorphous silicon layer on the buffer layer, forming a barrier layer on a substrate and forming the buffer layer on the barrier layer.

In the present embodiment, the buffer layer may include a first buffer layer, a second buffer layer on the first buffer layer, and a third buffer layer on the second buffer layer, and a hydrogen concentration of the first buffer layer may be greater than a hydrogen concentration of the second buffer layer.

In the present embodiment, the barrier layer may include a first layer, a second layer on the first layer, and a third layer on the second layer, and a hydrogen concentration of the second layer may be greater than a hydrogen concentration of the first layer.

In the present embodiment, the second layer may have a surface roughness within the range and including 3 nm to 5 nm.

In the present embodiment, the first layer may have a first thickness in a direction perpendicular to the substrate, and the first thickness may be within the range and including 50 Å to 300 Å.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
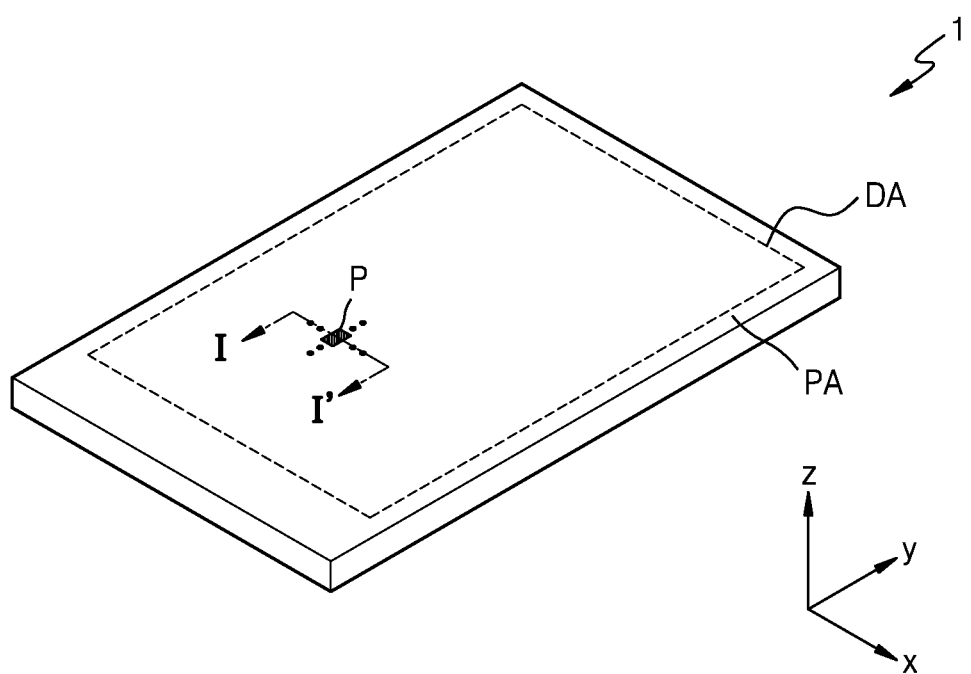
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises," "comprising," "includes," and "including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. For example, since sizes and thicknesses of components in the drawings are arbitrarily illustrated for convenience of explanation, the following embodiments are not limited thereto.

In an embodiment below, the meaning that the wiring "extends in the first direction or the second direction" includes not only extending in a linear shape, but also extending in a zigzag or a curve along the first direction or the second direction.

In the following embodiments, when referred to as "on a plane," this means when an object part is viewed from above, and when it is referred to as "in a cross-section," it means when the cross-section where the object part is cut vertically is viewed from the side. In the following embodiments, when referred to as "overlapping," it includes overlapping "on a plane" and "in a cross-section."

Hereinafter, exemplary embodiments will be described in detail with reference to the accompanying drawings, and in the description with reference to the drawings, the same or corresponding constituents are indicated by the same reference numerals.

One or more embodiments include display apparatuses in which afterimages are prevented or reduced by including fluorine at an interface between a semiconductor layer and a barrier layer and in which reliability may be improved. One or more embodiments include methods of manufacturing the display apparatuses.

FIG. 1 is a schematic perspective view of a display apparatus 1 according to an embodiment.

Referring to FIG. 1, the display apparatus 1 may include a display area DA and a peripheral area PA disposed around the display area DA. The peripheral area PA may surround the display area DA. The display apparatus 1 may provide an image by using light emitted from pixels P arranged in the display area DA, and the peripheral area PA may be a non-display area where no image is displayed.

In the following description, an organic light-emitting display apparatus is described as an example of the display apparatus 1 according to an embodiment, but the display apparatus 1 is not limited thereto. In an embodiment, the display apparatus 1 may be a display apparatus such as an inorganic light-emitting display apparatus (inorganic light-emitting display or inorganic EL display) or a quantum dot light-emitting display apparatus. For example, an emission layer of a display element provided in the display apparatus 1 may include an organic material, an inorganic material, quantum dots, an organic material and quantum dots, or an inorganic material and quantum dots.

FIG. 1 illustrates the display apparatus 1 having a flat display surface, but the disclosure is not limited thereto. In an embodiment, the display apparatus 1 may include a three-dimensional display surface or a curved display surface.

When the display apparatus 1 includes a three-dimensional display surface, the display apparatus 1 may include a plurality of display areas directed in different directions, for example, a polygonal column-type display surface. In an embodiment, when the display apparatus 1 includes a curved display surface, the display apparatus 1 may be implemented in various shapes such as flexible, foldable, rollable display apparatuses, and the like.

FIG. 1 illustrates the display apparatus 1 that may be applied to mobile phone terminals. Although not illustrated, as an electronic module, a camera module, a power module, and the like, which are mounted on a mainboard, are arranged on a bracket/case, and the like, with the display apparatus 1, a mobile phone terminal may be formed. In particular, the display apparatus 1 may be applied to not only large electronic apparatuses such as televisions, monitors, and the like, but also mid- or small-sized electronic apparatuses such as tablets, car navigations, game consoles, smartwatches, and the like.

Although FIG. 1 illustrates a case in which the display area DA of the display apparatus 1 is rectangular, the shape of the display area DA may be circular, oval, or polygonal such as triangular, pentagonal, and the like.

The display apparatus 1 may include the pixels P arranged in the display area DA. Each of the pixels P may include an organic light-emitting diode (OLED). Each of the pixels P may emit light, for example, red, green, blue, or white light through the organic light-emitting diode OLED. Each pixel P may be understood as a pixel that emits light of any one red, green, blue, and white colors as described above.

Figure 2:
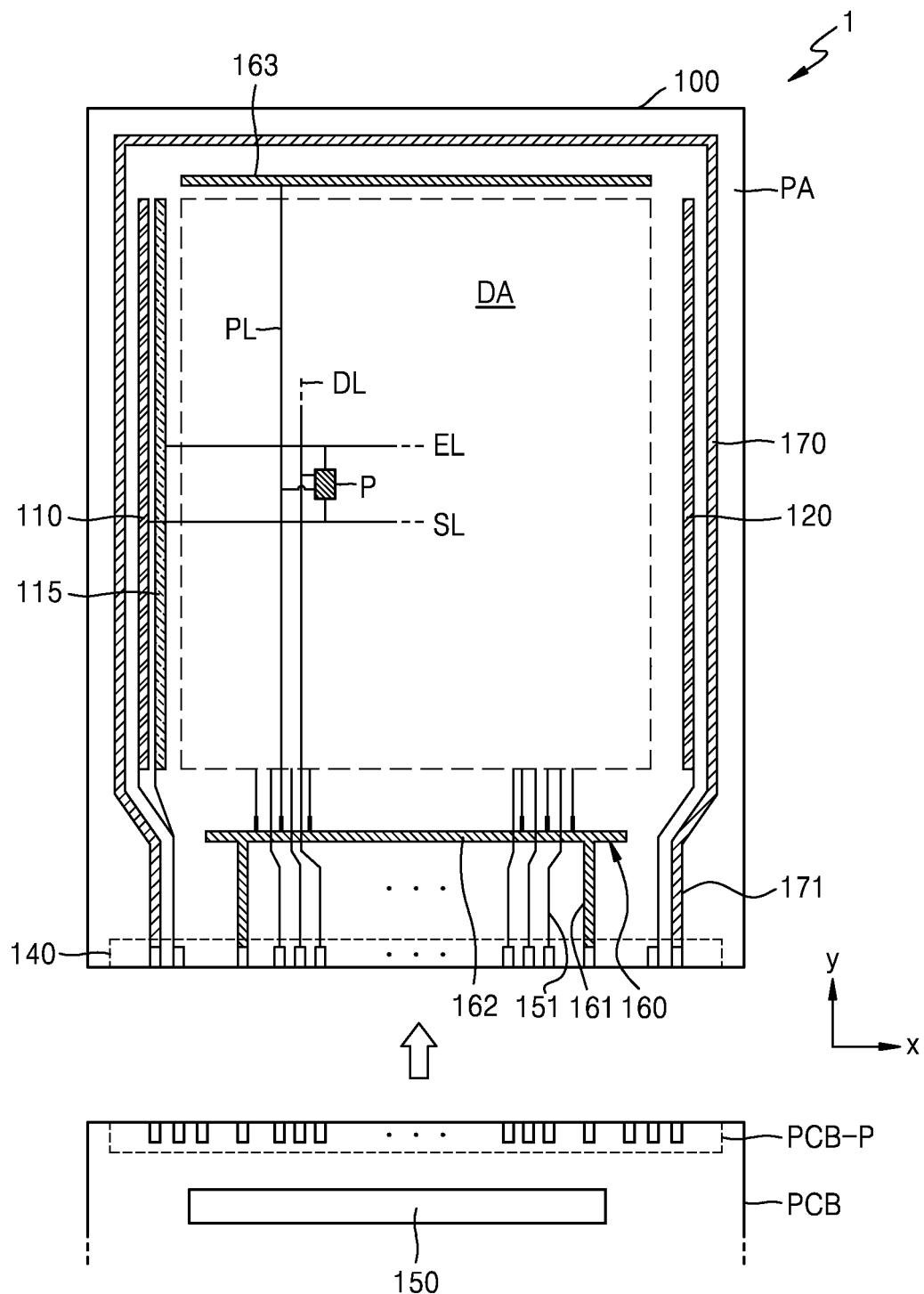
FIG. 2 is a schematic plan view of a display apparatus according to an embodiment.

FIG. 2 is a schematic plan view of a display apparatus according to an embodiment.

Referring to FIG. 2, the display apparatus 1 may include the pixels P arranged in the display area DA. Each pixel P may be electrically connected to external circuits arranged in the peripheral area PA. A first scan driving circuit 110, a first emission driving circuit 115, a second scan driving circuit 120, a terminal 140, a data driving circuit 150, a first power supply wiring 160, and a second power supply wiring 170 may be arranged in the peripheral area PA.

The first scan driving circuit 110 may provide a scan signal to each pixel P through a scan line SL. The first emission driving circuit 115 may provide an emission control signal to each pixel P through an emission control line EL. The second scan driving circuit 120 may be arranged parallel to the first scan driving circuit 110 with the display area DA therebetween. In an embodiment, some of the pixels P arranged in the display area DA may be electrically connected to the first scan driving circuit 110, and the other of the pixels P may be electrically connected to the second scan driving circuit 120. In an embodiment, the second scan driving circuit 120 may be omitted.

The first emission driving circuit 115 may be arranged in the peripheral area PA to be spaced apart from the first scan driving circuit 110 in an x direction. Furthermore, the first emission driving circuit 115 may be arranged alternately with the first scan driving circuit 110 in a y direction.

The terminal 140 may be arranged at one side of a substrate 100. The terminal 140 may be exposed, not covered by an insulating layer, to be electrically connected to a printed circuit board PCB. A terminal PCB-P of the printed circuit board PCB may be electrically connected to the terminal 140 of the display apparatus 1. The printed circuit board PCB may transmit a signal or power of a controller (not shown) to the display apparatus 1. A control signal generated by the controller may be transmitted to each of the first scan driving circuit 110, the first emission driving circuit 115, and the second scan driving circuit 120 through the printed circuit board PCB. The controller may provide a first power voltage ELVDD or a driving voltage, and a second power voltage ELVSS or common voltage to each of the first power supply wiring 160 and the second power supply wiring 170 through a first connection wiring 161 and a second connection wiring 171. The first power voltage ELVDD may be provided to each pixel P through a driving voltage line PL connected to the first power supply wiring 160, and a second power voltage ELVSS may be provided to a counter electrode of each pixel P connected to the second power supply wiring 170.

The data driving circuit 150 may be electrically connected to a data line DL. A data signal of the data driving circuit 150 may be provided to each pixel P through a connection wiring 151 connected to the terminal 140 and the data line DL connected to the connection wiring 151.

In FIG. 2, the data driving circuit 150 is arranged on the printed circuit board PCB. However, in an embodiment, the data driving circuit 150 may be arranged on the substrate 100. For example, the data driving circuit 150 may be arranged between the terminal 140 and the first power supply wiring 160.

The first power supply wiring 160 may include a first sub-wiring 162 and a second sub-wiring 163 that extend in parallel in the x direction with the display area DA therebetween. The second power supply wiring 170 has a loop shape with one side open and may partially surround the display area DA.

Figure 3:
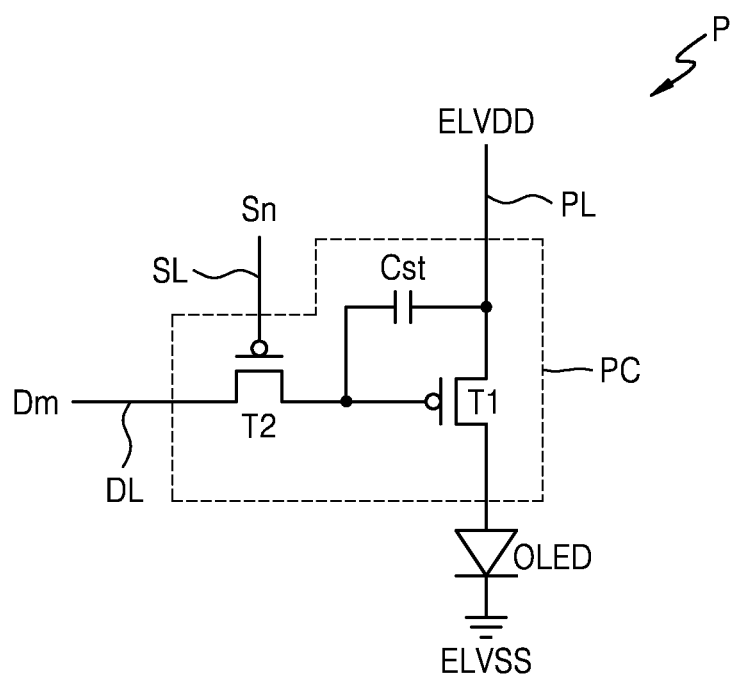
FIGS. 3 and 4 are equivalent circuit diagrams of a pixel included in a display apparatus according to an embodiment.
Figure 4:
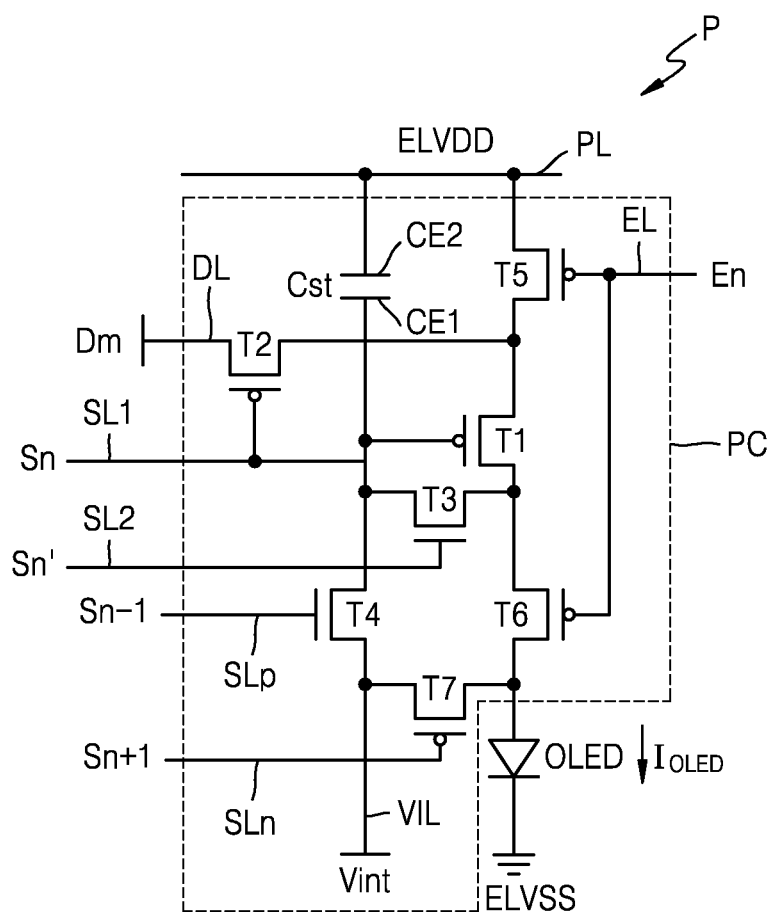

FIGS. 3 and 4 are equivalent circuit diagrams of a pixel included in a display apparatus according to an embodiment.

Referring to FIG. 3, each pixel P may include a pixel circuit PC connected to the scan line SL and the data line DL, and the organic light-emitting diode OLED connected to the pixel circuit PC.

The pixel circuit PC may include a driving thin film transistor T1, a switching thin film transistor T2, and a storage capacitor Cst. The switching thin film transistor T2 may be connected to the scan line SL and the data line DL, and may transmit a data signal Dm input through the data line DL to a driving thin film transistor T1 in response to a scan signal Sn input through the scan line SL.

The storage capacitor Cst may be connected to the switching thin film transistor T2 and the driving voltage line PL, and may store a voltage corresponding to a difference between a voltage received from the switching thin film transistor T2 and a driving voltage ELVDD (or first power voltage) supplied to the driving voltage line PL.

The driving thin film transistor T1 is connected to the driving voltage line PL and the storage capacitor Cst, and may control a driving current flowing to the organic light-emitting diode OLED through the driving voltage line PL, corresponding to a value of the voltage stored in the storage capacitor Cst. The organic light-emitting diode OLED may emit light having a certain luminance according to the driving current.

FIG. 3 illustrates a case in which the pixel circuit PC includes two thin film transistor and one storage capacitor, but the disclosure is not limited thereto. For example, the pixel circuit PC may include three or more thin film transistors, or two or more storage capacitors. In an embodiment, the pixel circuit PC may include seven thin film transistors and one storage capacitor. Alternatively, the pixel circuit PC may include seven thin film transistors and two storage capacitors Referring to FIG. 4, each pixel P may include the pixel circuit PC and the organic light-emitting diode OLED electrically connected to the pixel circuit PC.

In an embodiment, the pixel circuit PC may include, as illustrated in FIG. 4, a plurality of thin film transistors T1 to T7 and a storage capacitor Cst. The thin film transistors T1 to T7 and the storage capacitor Cst may be connected to signal lines SL1, SL2, SLp, SLn, EL, and DL, an initialization voltage line VIL, and a driving voltage line PL. In an embodiment, at least any one of the signal lines SL1, SL2, SLp, SLn, EL, and DL, the initialization voltage line VIL, and the driving voltage line PL may be shared by the pixels P that neighbor each other.

The thin film transistor may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

Some of the thin film transistors T1 to T7 may be provided as an n-channel MOSFET (NMOS), and the others may be provided as a p-channel MOSFET (PMOS).

For example, as illustrated in FIG. 4, among the thin film transistors T1 to T7, the compensation thin film transistor T3 and the first initialization thin film transistor T4 each may be provided as an NMOS, and the other thin film transistors may be provided as a p-PMOS.

In an embodiment, among the thin film transistors T1 to T7, the compensation thin film transistor T3, the first initialization thin film transistor T4, and the second initialization thin film transistor T7 may be provided as an n-channel MOSFET (NMOS), and the other thin film transistors may be provided as a p-channel MOSFET (PMOS). Alternatively, among the thin film transistors T1 to T7, only one thin film transistor may be provided as an NMOS while the other thin film transistors may be provided as a PMOS. Alternatively, all the thin film transistors T1 to T7 may be provided as an NMOS.

The signal line may include a first scan line SL1 for transmitting a first scan signal Sn, a second scan line SL2 for transmitting a second scan signal Sn', a previous scan line SLp for transmitting a previous scan signal Sn-1 to the first initialization thin film transistor T4, the emission control line EL for transmitting an emission control signal En to the operation control thin film transistor T5 and the emission control thin film transistor T6, a next scan line SLn for transmitting a next scan signal Sn+1 to the second initialization thin film transistor T7, and the data line DL crossing the first scan line SL1 and transmitting the data signal Dm.

The driving voltage line PL may transmit the driving voltage ELVDD to the driving thin film transistor T1, and the initialization voltage line VIL may transmit an initialization voltage Vint that initializes the driving thin film transistor T1 and a pixel electrode of the organic light-emitting diode OLED.

A driving gate electrode of the driving thin film transistor T1 may be connected to the storage capacitor Cst. A driving source region of the driving thin film transistor T1 may be connected to the driving voltage line PL via the operation control thin film transistor T5. A driving drain region of the driving thin film transistor T1 may be connected to the pixel electrode of the organic light-emitting diode OLED via the emission control thin film transistor T6. The driving thin film transistor T1 may receive the data signal Dm according to a switching operation of the switching thin film transistor T2 and supply a driving current $I_{OLED}$ to the organic light-emitting diode OLED.

A switching gate electrode of the switching thin film transistor T2 may be connected to the first scan line SL1. A switching source region of the switching thin film transistor T2 may be connected to the data line DL. A switching drain region of the switching thin film transistor T2 may be connected to the driving source region of the driving thin film transistor T1 and also to the driving voltage line PL via the operation control thin film transistor T5. The switching thin film transistor T2 may be turned-on in response to the first scan signal Sn received through the first scan line SL1 to perform a switching operation for transmitting the data signal Dm transmitted through the data line DL to the driving source region of the driving thin film transistor T1.

A compensation gate electrode of the compensation thin film transistor T3 may be connected to the second scan line SL2. A compensation drain region of the compensation thin film transistor T3 may be connected to the driving drain region of the driving thin film transistor T1 and to the pixel electrode of the organic light-emitting diode OLED via the emission control thin film transistor T6. A compensation source region of the compensation thin film transistor T3 may be connected to a first electrode CE1 of the storage capacitor Cst and the driving gate electrode of the driving thin film transistor T1. Furthermore, the compensation source region of the compensation thin film transistor T3 may be connected to a first initialization drain region of the first initialization thin film transistor T4.

The compensation thin film transistor T3 may be turned-on in response to the second scan signal Sn' received through the second scan line SL2 to electrically connect the driving gate electrode of the driving thin film transistor T1 to the driving drain region of the driving thin film transistor T1, thereby diode-connecting the driving thin film transistor T1.

A first initialization gate electrode of the first initialization thin film transistor T4 may be connected to the previous scan line SLp. A first initialization source region of the first initialization thin film transistor T4 may be connected to the second initialization source region of the second initialization thin film transistor T7 and the initialization voltage line VIL. The first initialization drain region of the first initialization thin film transistor T4 may be connected to the first electrode CE1 of the storage capacitor Cst, the compensation source region of the compensation thin film transistor T3, and the driving gate electrode of the driving thin film transistor T1. The first initialization thin film transistor T4 may be turned-on in response to the previous scan signal Sn-1 received through the previous scan line SLp to transmit the initialization voltage Vint to the driving gate electrode of the driving thin film transistor T1, thereby performing an initialization operation for initializing a voltage of the driving gate electrode of the driving thin film transistor T1.

An operation control gate electrode of the operation control thin film transistor T5 may be connected to the emission control line EL. An operation control source region of the operation control thin film transistor T5 may be connected to the driving voltage line PL. An operation control drain region of the operation control thin film transistor T5 may be connected to the driving source region of the driving thin film transistor T1 and the switching drain region of the switching thin film transistor T2.

An emission control gate electrode of the emission control thin film transistor T6 may be connected to the emission control line EL. An emission control source region of the emission control thin film transistor T6 may be connected to the driving drain region of the driving thin film transistor T1 and the compensation drain region of the compensation thin film transistor T3. An emission control drain region of the emission control thin film transistor T6 may be electrically connected to a second initialization drain region of the second initialization thin film transistor T7 and the pixel electrode of the organic light-emitting diode OLED.

The operation control thin film transistor T5 and the emission control thin film transistor T6 may be simultaneously turned-on in response to the emission control signal En received through the emission control line EL to transmit the driving voltage ELVDD to the organic light-emitting diode OLED, thereby allowing the driving current $I_{OLED}$ to flow in the organic light-emitting diode OLED.

A second initialization gate electrode of the second initialization thin film transistor T7 may be connected to the next scan line SLn. The second initialization drain region of the second initialization thin film transistor T7 may be connected to the emission control drain region of the emission control thin film transistor T6 and the pixel electrode of the organic light-emitting diode OLED. The second initialization source region of the second initialization thin film transistor T7 may be connected to the first initialization source region of the first initialization thin film transistor T4 and the initialization voltage line VIL. The second initialization thin film transistor T7 may be turned-on in response to the next scan signal Sn+1 received through the next scan line SLn to initialize the pixel electrode of the organic light-emitting diode OLED.

The second initialization thin film transistor T7 may be connected to the next scan line SLn, as illustrated in FIG. 4. In an embodiment, the second initialization thin film transistor T7 may be connected to the emission control line EL and driven according to the emission control signal En. The positions of the source regions and the drain regions may be switched according to the type, that is, p-type or n-type, of a transistor.

The storage capacitor Cst may include the first electrode CE1 and a second electrode CE2. The first electrode CE1 of the storage capacitor Cst may be connected to the driving gate electrode of the driving thin film transistor T1, and the second electrode CE2 of the storage capacitor Cst may be connected to the driving voltage line PL. The storage capacitor Cst may store charges corresponding to a difference between the voltage of the driving gate electrode of the driving thin film transistor T1 and the driving voltage ELVDD.

A specific operation of each pixel P according to an embodiment is described below.

During an initialization period, when the previous scan signal Sn-1 is supplied through the previous scan line SLp, the first initialization thin film transistor T4 is turned on in response to the previous scan signal Sn-1, and the driving thin film transistor T1 is initialized by the initialization voltage Vint supplied through the initialization voltage line VIL.

During a data programming period, when the first scan signal Sn and the second scan signal Sn' are supplied through the first scan line SL1 and the second scan line SL2, the switching thin film transistor T2 and the compensation thin film transistor T3 are turned-on in response to the first scan signal Sn and the second scan signal Sn'. At this time, the driving thin film transistor T1 is diode-connected by the compensation thin film transistor T3 that is turned on, and biased in a forward direction.

Then, a compensation voltage (Dm+Vth, where Vth is a (−) value) obtained by subtracting a threshold voltage Vth of the driving thin film transistor T1 from the data signal Dm supplied through the data line DL is applied to the driving gate electrode G1 of the driving thin film transistor T1.

The driving voltage ELVDD and the compensation voltage (Dm+Vth) are applied to both ends of the storage capacitor Cst, and charges corresponding to a voltage difference between both ends thereof are stored in the storage capacitor Cst.

During a light-emission period, the operation control thin film transistor T5 and the emission control thin film transistor T6 are turned-on by the emission control signal En supplied through the emission control line EL. The driving current $I_{OLED}$ is generated according to the voltage difference between the voltage of the driving gate electrode of the driving thin film transistor T1 and the driving voltage ELVDD, and the driving current $I_{OLED}$ is supplied to the organic light-emitting diode OLED through the emission control thin film transistor T6.

In an embodiment, among the thin film transistors T1 to T7, at least one thin film transistor may include a semiconductor layer including an oxide semiconductor, and the other thin film transistors each may include a semiconductor layer including a silicon semiconductor.

In detail, the driving thin film transistor T1 that directly affects the brightness of a display apparatus may include a semiconductor layer including polycrystalline silicon having high reliability, and thus, a high-resolution display apparatus may be implemented.

As the oxide semiconductor has a high carrier mobility and a low leakage current, a voltage drop is not much even when a driving time is long. In other words, even during low frequency driving, as a change in the color of an image according to the voltage drop is not much voltage drop, the low frequency driving may be performed.

As such, as the oxide semiconductor has an advantage of having a small leakage current, by employing, as an oxide semiconductor, at least one of the compensation thin film transistor T3, the first initialization thin film transistor T4, and the second initialization thin film transistor T7, which are connected to the driving gate electrode of the driving thin film transistor T1, a leakage current that may flow to the driving gate electrode may be prevented, and simultaneously, consumption power may be reduced.

In an embodiment, the driving thin film transistor T1, the switching thin film transistor T2, the operation control thin film transistor T5, the emission control thin film transistor T6, and the second initialization thin film transistor T7 may be provided as a semiconductor layer including a silicon semiconductor, and the compensation thin film transistor T3 and the first initialization thin film transistor T4 may be provided as a semiconductor layer including an oxide semiconductor. However, the disclosure is not limited thereto.

Figure 5:
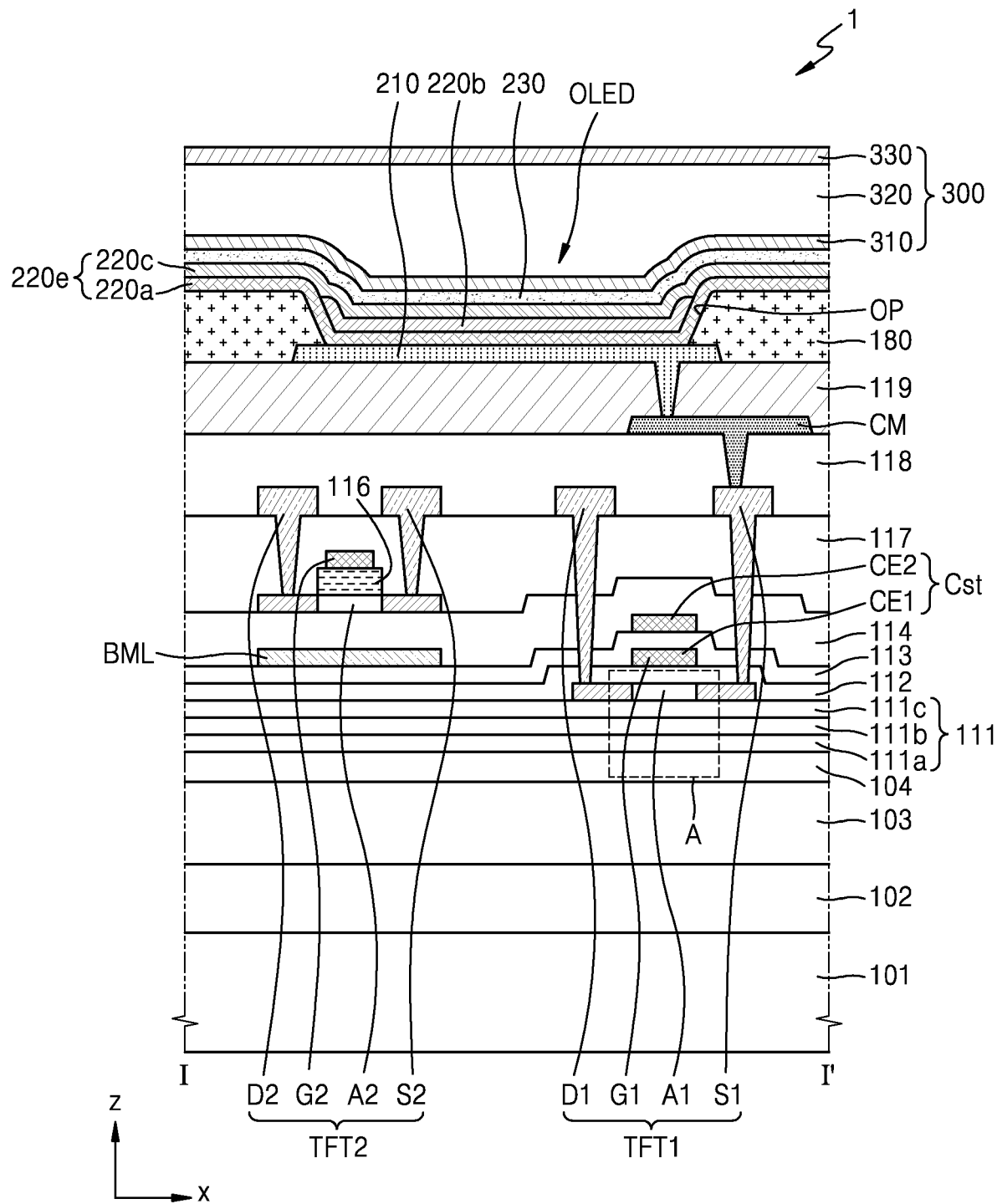
FIG. 5 is a schematic cross-sectional view of a display apparatus according to an embodiment.

FIG. 5 is a schematic cross-sectional view of the display apparatus 1 according to an embodiment.

In the following description, a stacking structure of the display apparatus 1 is briefly described with reference to FIG. 5.

Referring to FIG. 5, a first barrier layer 102 may be disposed on a first substrate 101. The first substrate 101 may include polymer resin. The first substrate 101 including polymer resin may be flexible, rollable, or bendable. In an embodiment, the first substrate 101 may include polyether-sulfone, polyacrylate, polyether imide, polyethylene naphthalate, polyethylene terephthalate, polyphenylene sulfide, polyarylate, polycarbonate, cellulose acetate propionate, and the like. In an embodiment, the first substrate 101 may include polyimide. For example, the first substrate 101 may include transparent polyimide.

The first barrier layer 102 may be disposed on the first substrate 101. The first barrier layer 102 may include an inorganic insulating material such as a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), a zinc oxide (ZnO), and the like.

A second substrate 103 may be disposed on the first barrier layer 102. In an embodiment, the second substrate 103 may include the same material as the first substrate 101. For example, the second substrate 103 may include polyimide. In an embodiment, the second substrate 103 may include a material different from the first substrate 101.

A second barrier layer 104 may be disposed on the second substrate 103. In an embodiment, the second barrier layer 104 may include the same material as the first barrier layer 102. In an embodiment, the second barrier layer 104 may include a material different from the first barrier layer 102.

The first barrier layer 102 is disposed on the first substrate 101 and may prevent or reduce damage to the thin film transistor due to foreign materials, moisture, or external air from under the first substrate 101. Furthermore, the second barrier layer 104 may be arranged between the first substrate 101 and the second substrate 103 to prevent or reduce damage to the thin film transistor due to foreign materials, moisture, or external air from thereunder.

A buffer layer 111 may be disposed on the second barrier layer 104. The buffer layer 111 may include a first buffer layer 111a, a second buffer layer 111b, and a third buffer layer 111c, as described below in detail with respect to FIG. 6.

The buffer layer 111 is disposed on the first substrate 101 and the second substrate 103 and may prevent or reduce infiltration of foreign materials, moisture, or external air from under the first substrate 101 and the second substrate 103 and provide a planarized surface on the first substrate 101 and the second substrate 103. The buffer layer 111 may include an inorganic insulating material such as a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), a zinc oxide (ZnO), and the like.

A first thin film transistor TFT1 including a first semiconductor layer A1, a first gate electrode G1, a first source electrode S1, and a first drain electrode D1 may be disposed on the buffer layer 111. In an embodiment, the first semiconductor layer A1 may include a silicon semiconductor. For example, the first semiconductor layer A1 may include low temperature poly-silicon (LTPS) obtained by crystallizing amorphous silicon (a-Si).

A first insulating layer 112 may be disposed on the first semiconductor layer A1. The first insulating layer 112 may include an inorganic material including oxide or nitride. In an embodiment, the first insulating layer 112 may include at least one of a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), or a zinc oxide (ZnO).

The first gate electrode G1 may be disposed on the first insulating layer 112. The first gate electrode G1 may include one or more metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or multilayer. The first gate electrode G1 may be connected to a gate line for applying an electrical signal to the first gate electrode G1.

A second insulating layer 113 may be disposed on the first gate electrode G1. The second insulating layer 113 may include at least one inorganic insulating material selected from the group consisting of a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), and a zinc oxide (ZnO). The second insulating layer 113 may be a single layer or multilayer including the above-described inorganic insulating materials.

The storage capacitor Cst may be disposed on the first insulating layer 112. The storage capacitor Cst may include the first electrode CE1 and the second electrode CE2 that overlaps the first electrode CE1. The first electrode CE1 and the second electrode CE2 of the storage capacitor Cst may overlap with each other with the second insulating layer 113 therebetween.

In an embodiment, the first electrode CE1 of the storage capacitor Cst may overlap the first gate electrode G1 of the first thin film transistor TFT1, and the first electrode CE1 of the storage capacitor Cst may be provided integrally with the first gate electrode G1 of the first thin film transistor TFT1. In an embodiment, the first electrode CE1 of the storage capacitor Cst, as a separate independent constituent element spaced apart from the first gate electrode G1 of the first thin film transistor TFT1, may be disposed on the first insulating layer 112. In this case, the first electrode CE1 of the storage capacitor Cst may include the same material as the first gate electrode G1.

The second electrode CE2 of the storage capacitor Cst may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), and may be a single layer or multilayer of the above-described materials.

A third insulating layer 114 may be disposed on the second electrode CE2 of the storage capacitor Cst. The third insulating layer 114 may include at least one inorganic insulating material selected from the group consisting of a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), and a zinc oxide (ZnO). The third insulating layer 114 may be a single layer or multilayer including the above-described inorganic insulating materials.

A second thin film transistor TFT2 including a second semiconductor layer A2, a second gate electrode G2, a second source electrode S2, and a second drain electrode D2 may be disposed on the buffer layer 111.

In an embodiment, a lower metal layer BML may be disposed under the second thin film transistor TFT2. The lower metal layer BML may at least partially overlap the second thin film transistor TFT2. The lower metal layer BML may be disposed under the second thin film transistor TFT2 and may protect constituent elements included in the second thin film transistor TFT2. For example, the lower metal layer BML may at least partially overlap the second semiconductor layer A2 or the second gate electrode G2, and may be disposed under the second semiconductor layer A2 or the second gate electrode G2 to protect the second semiconductor layer A2 or the second gate electrode G2.

In an embodiment, the lower metal layer BML may be disposed on the second insulating layer 113. The lower metal layer BML may be disposed on the same layer as the second electrode CE2 of the storage capacitor Cst, and may include the same material. In an embodiment, the lower metal layer BML may be disposed on the first insulating layer 112. The lower metal layer BML may be disposed on the same layer as the first gate electrode G1 of the first thin film transistor TFT1, and may include the same material.

The second semiconductor layer A2 may be disposed on the lower metal layer BML. The second semiconductor layer A2 may be disposed on the third insulating layer 114. The second semiconductor layer A2 may include an oxide semiconductor. For example, the second semiconductor layer A2 may include an oxide of at least one material selected from the group consisting of oxide indium (In), gallium (Ga), tin (Sn), zirconium (Zr), vanadium (V), hafnium (Hf), cadmium (Cd), germanium (Ge), chromium (Cr), titanium (Ti), and zinc (Zn). In an embodiment, the second semiconductor layer A2 may include ITZO (InSnZnO), IGZO (InGaZnO), and the like.

A fourth insulating layer 116 may be disposed on the second semiconductor layer A2. The fourth insulating layer 116 may include an inorganic material including oxide or nitride. For example, the fourth insulating layer 116 may include at least one of a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), or a zinc oxide (ZnO).

The second gate electrode G2 may be disposed on the fourth insulating layer 116. The second gate electrode G2 may include one or more metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or multilayer.

In an embodiment, the fourth insulating layer 116 may be patterned to corresponding to the second gate electrode G2 on the fourth insulating layer 116. Alternatively, although not illustrated, the fourth insulating layer 116 may be integrally provided to cover the second semiconductor layer A2.

A fifth insulating layer 117 may be disposed on the second gate electrode G2. The fifth insulating layer 117 may include an inorganic material including oxide or nitride. For example, the fifth insulating layer 117 may include at least one of a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), or a zinc oxide (ZnO).

The first source electrode S1, the first drain electrode D1, the second source electrode S2, and the second drain electrode D2 may be disposed on the fifth insulating layer 117. The first source electrode S1, the first drain electrode D1, the second source electrode S2, and the second drain electrode D2 each may include a conductive material including molybdenum (Mo), aluminum (Al), copper (Cu), titanium (Ti), and the like, and may be formed in a multilayer or single layer including the above materials. The first source electrode S1, the first drain electrode D1, the second source electrode S2, and the second drain electrode D2 each may have a multilayer structure of Ti/Al/Ti.

A first planarization layer 118 may be disposed on the first source electrode S1, the first drain electrode D1, the second source electrode S2, and the second drain electrode D2. The first planarization layer 118 may be a film including an organic material or an inorganic material in a single layer or multilayer. In an embodiment, the first planarization layer 118 may include a general purpose polymer such as benzocyclobutene (BCB), polyimide (PI), hexamethyldisiloxane (HMDSO), poly(methyl methacrylate) (PMMA), or polystyrene (PS), polymer derivatives having a phenolic group, an acrylic polymer, an imide-based polymer, an aryl ether-based polymer, an amide-based polymer, a fluorine-based polymer, a p-xylene-based polymer, a vinyl alcohol-based polymer, blends thereof, and the like. The first planarization layer 118 may include an inorganic insulating material such as a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$) a zinc oxide (ZnO), and the like. After the first planarization layer 118 is formed, chemical mechanical polishing may be performed to provide a flat upper surface.

A connection electrode CM may be disposed on the first planarization layer 118. The connection electrode CM may be electrically connected to the first source electrode S1 or the first drain electrode D1 via a contact hole defined in the first planarization layer 118.

A second planarization layer 119 may be disposed on the connection electrode CM. In an embodiment, the second planarization layer 119 may include the same material as the first planarization layer 118. Alternatively, the second planarization layer 119 may include a material different form the first planarization layer 118.

The organic light-emitting diode OLED including a pixel electrode 210, an emission layer 220b, and a counter electrode 230 may be disposed on the second planarization layer 119. The pixel electrode 210 may be disposed on the second planarization layer 119. The pixel electrode 210 may be a (semi-)transmissive electrode or a reflective electrode. The pixel electrode 210 may include a reflective film including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), a compound thereof, and the like, and a transparent or semi-transparent electrode layer formed on the reflective film. The transparent or semi-transparent electrode layer may include at least one material selected from the group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO). The pixel electrode 210 may have a stacked structure of ITO/Ag/ITO.

A pixel definition layer 180 may be disposed on the second planarization layer 119, and the pixel definition layer 180 may have an opening OP that exposes at least a part of the pixel electrode 210. An area exposed by the opening OP of the pixel definition layer 180 may be defined as a light-emitting area. The periphery of the light-emitting area is a non-light-emitting area, and the non-light-emitting area may surround the light-emitting area. In other words, the display area DA may include a plurality of light-emitting areas and a non-light-emitting area surrounding the light-emitting areas. The pixel definition layer 180 may increase a distance between the pixel electrode 210 and the counter electrode 230 above the pixel electrode 210, thereby preventing generation of arcs and the like at an edge of the pixel electrode 210. The pixel definition layer 180 may include an organic insulating material, for example, polyimide, polyamide, acryl resin, benzocyclobutene, hexamethyldisiloxane, phenol resin, and the like, by a spin coating method and the like. In an embodiment, a spacer (not shown) may be further disposed on the pixel definition layer 180.

An intermediate layer may be disposed on the pixel electrode 210 that is at least partially exposed by the pixel definition layer 180. The intermediate layer may include the emission layer 220b, and a first functional layer 220a and a second functional layer 220c may be optionally and respectively arranged under and above the emission layer 220b.

In an embodiment, the first functional layer 220a may be disposed under the emission layer 220b, and the second functional layer 220c may be disposed above the emission layer 220b. The first functional layer 220a and the second functional layer 220c respectively disposed under and above the emission layer 220b may be collectively referred to as organic functional layers 220e.

The first functional layer 220a may include an electron injection layer (HIL) or a hole transport layer (HTL), and the second functional layer 220c may include an electron transport layer (ETL) or an electron injection layer (EIL).

The emission layer 220b may include an organic material including a fluorescent or phosphorescent material that emits red, green, blue, or white light. The emission layer 220b may include a low molecular weight organic material or a polymer organic material.

When the emission layer 220b includes a low molecular weight organic material, the intermediate layer may have a structure in which the hole injection layer, the hole injection layer, the emission layer 220b, the electron transport layer, the electron injection layer, and the like are stacked in a single or complex structure, and may include, as the low molecular weight organic material, various organic materials such as copper phthalocyanine (CuPc), N,N'-Di(napthalene-1-yl)-N,N'-diphenyl-benzidine (NPB), tris-8-hydroxyquinoline aluminum (Alq3), and the like.

When the emission layer 220b includes a polymer organic material, the intermediate layer may generally have a structure including the hole injection layer and the emission layer 220b. At this time, the hole injection layer may include PEDOT, and the emission layer 220b may include a polymer material such as a poly-phenylene vinylene (PPV)-based polymer material, a polyfluorene-based polymer material, and the like. The emission layer 220b may be formed by a screen printing or inkjet printing method, laser induced thermal imaging (LITI), and the like.

The counter electrode 230 may be disposed on the intermediate layer. The counter electrode 230 may be disposed on the intermediate layer, to entirely cover the intermediate layer. The counter electrode 230 may be disposed above the display area DA, to entirely cover the display area DA. In other words, the counter electrode 230 may be integrally formed in the whole display area to cover the pixels P arranged in the display area DA, by using an open mask.

The counter electrode 230 may include a conductive material having a low work function. For example, the counter electrode 230 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), an alloy thereof, and the like. Alternatively, the counter electrode 230 may further include a layer including ITO, IZO, ZnO, or $In_2O_3$ on the (semi-)transparent layer including the above-described material.

In an embodiment, a thin film encapsulation layer 300 may be disposed on the organic light-emitting diode OLED. The thin film encapsulation layer 300 may include at least one inorganic layer and at least one organic layer. In an embodiment, the thin film encapsulation layer 300 may include a first inorganic layer 310, an organic layer 320, and a second inorganic layer 330, which are sequentially stacked.

The first inorganic layer 310 and the second inorganic layer 330 each may include at least one inorganic insulating material selected from the group consisting of a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), and a zinc oxide (ZnO). The organic layer 320 may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, acrylic resin, for example, polymethyl methacrylate, polyacryl acid, and the like, or any combination thereof.

Figure 6:
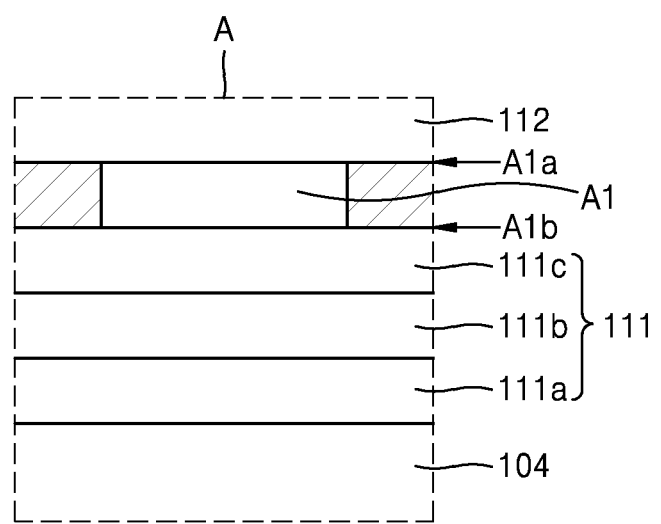
FIG. 6 is a schematic cross-sectional view of a display apparatus according to an embodiment.

FIG. 6 is a schematic cross-sectional view of a display apparatus according to an embodiment. In detail, FIG. 6 is an enlarged view of a region A of FIG. 5.

Referring to FIG. 6, the buffer layer 111 may be disposed on the second barrier layer 104, the first semiconductor layer A1 may be disposed on the buffer layer 111, and the first insulating layer 112 may be disposed on the first semiconductor layer A1.

In an embodiment, the buffer layer 111 may include the first buffer layer 111a, the second buffer layer 111b, and the third buffer layer 111c. The first buffer layer 111a may be disposed directly on the second barrier layer 104, and the first semiconductor layer A1 may be disposed directly on the third buffer layer 111c.

Figure 7:
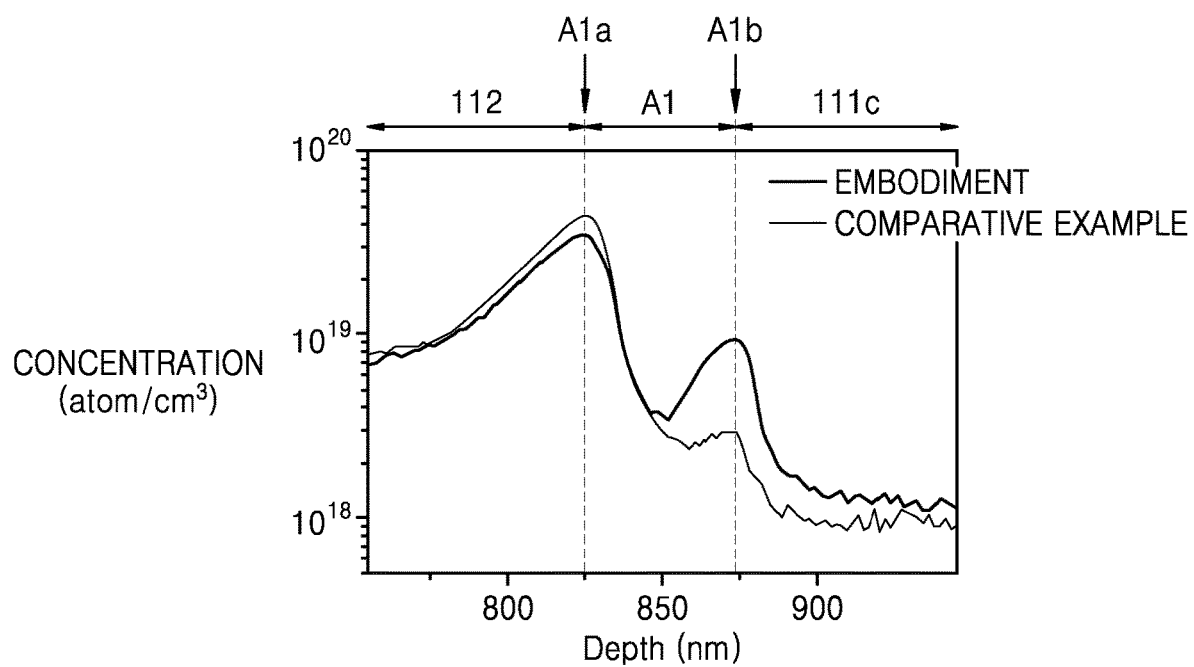
FIG. 7 is a graph of the measurement of the concentration of a first material of a first insulating layer, a first semiconductor layer, and a third buffer layer according to an embodiment and a comparative example.

FIG. 7 is a graph of the measurement of the concentration of a first material (fluorine) of the first insulating layer 112, the first semiconductor layer A1, the third buffer layer 111c according to an embodiment and a comparative example. The embodiment may correspond to a case in which a first material is injected (doped) before the crystallization of an amorphous silicon layer, whereas the comparative example may correspond to a case in which the first material is injected (doped) after an amorphous silicon layer is crystallized into a polycrystalline silicon layer. In detail, the embodiment may correspond to a case in which, after the injection (doping) of the first material into an amorphous silicon layer, the amorphous silicon layer into which the first material is injected (doped) is crystallized into a polycrystalline silicon layer, thereby forming a first semiconductor layer. The comparative example may correspond to a case in which, after the first semiconductor layer is formed by crystallizing the amorphous silicon layer into a polycrystalline silicon layer, the first material is injected (doped) into the first semiconductor layer.

Referring to FIGS. 6 and 7, the first material may be injected (doped) into the first semiconductor layer A1. In an embodiment, the first material may include fluorine, boron, arsenic, phosphorus, and the like. For example, the first material that is injected (doped) into the first semiconductor layer A1 may be fluorine.

When a crystallization process is formed after the first material, for example, fluorine, is injected (doped) into the amorphous silicon layer (embodiment), compared to a case in which the first material, for example, fluorine, is injected (doped) after the crystallization process is performed (comparative example), the concentration of the first material, for example, fluorine, at an interface A1b between the first semiconductor layer A1 and the buffer layer 111, for example, the third buffer layer 111c, may be relatively high.

The high concentration of the first material, for example, fluorine, at the interface A1b between the first semiconductor layer A1 and the buffer layer 111, for example, the third buffer layer 111c, may mean a large amount of the first material, for example, fluorine, at the interface A1b between the first semiconductor layer A1 and the buffer layer 111, for example, the third buffer layer 111c.

There may be defects at the interface A1b between the first semiconductor layer A1 and the buffer layer 111, for example, the third buffer layer 111c, and the defects at the interface A1b between the first semiconductor layer A1 and the buffer layer 111, for example, the third buffer layer 111c, may cause afterimages in the display apparatus.

As the first material, for example, fluorine, at the interface A1b between the first semiconductor layer A1 and the buffer layer 111, for example, the third buffer layer 111c, fills the defects at the interface A1b between the first semiconductor layer A1 and the buffer layer 111, for example, the third buffer layer 111c, the number of the defects at the interface A1b between the first semiconductor layer A1 and the buffer layer 111, for example, the third buffer layer 111c, may be decreased.

Accordingly, as the concentration of the first material, for example, fluorine, at the interface A1b between the first semiconductor layer A1 and the buffer layer 111, for example, the third buffer layer 111c, is high, the number of defects at the interface A1b between the first semiconductor layer A1 and the buffer layer 111, for example, the third buffer layer 111c, may be decreased, and thus, the generation of afterimages in the display apparatus may be prevented or reduced.

In the case in which the first material, for example, fluorine, is injected (doped) after the crystallization process is performed (comparative example), the concentration of the first material, for example, fluorine, at the interface A1b between the first semiconductor layer A1 and the buffer layer 111, for example, the third buffer layer 111c, may be about 9.5% of the concentration of the first material, for example, fluorine, at the interface A1a between the first semiconductor layer A1 and the first insulating layer 112.

In an embodiment, when the crystallization process is performed after the first material, for example, fluorine, is injected (doped) into the amorphous silicon layer (embodiment), the concentration of the first material, for example, fluorine, at the interface A1b between the first semiconductor layer A1 and the buffer layer 111, for example, the third buffer layer 111c, may be about 10% or more of the concentration of the first material, for example, fluorine, at the interface A1a between the first semiconductor layer A1 and the first insulating layer 112. Alternatively, in an embodiment, the concentration of the first material, for example, fluorine, at the interface A1b between the first semiconductor layer A1 and the buffer layer 111, for example, the third buffer layer 111c, may be about 12% or more of the concentration of the first material, for example, fluorine, at the interface A1a between the first semiconductor layer A1 and the first insulating layer 112.

In an embodiment, the minimum concentration of the first material, for example, fluorine, in the first semiconductor layer A1 may be about $1 \times 10^{20}$ atom/cm$^3$ or less. In an embodiment, the concentration of the first material, for example, fluorine, at the interface A1b between the first semiconductor layer A1 and the buffer layer 111, for example, the third buffer layer 111c, may be greater than the minimum concentration of the first material, for example, fluorine, in the first semiconductor layer A1.

In an embodiment, when the first material, for example, fluorine, is injected (doped) into the first semiconductor layer A1, the defects in the first semiconductor layer A1 are decreased so that the generation of afterimages in the display apparatus may be prevented or reduced.

In an embodiment, after the first material, for example, fluorine, is injected (doped) into the amorphous silicon layer, when the first semiconductor layer A1 is formed by crystallizing the amorphous silicon layer into which the first material, for example, fluorine, is injected (doped) into the polycrystalline silicon layer, the concentration of the first material, for example, fluorine, included in the first semiconductor layer A1 is increased, and as the first material, for example, fluorine, fills the defects in the first semiconductor layer A1, the defects in the first semiconductor layer A1 are decreased so that the generation of afterimages in the display apparatus may be prevented or reduced.

In particular, the concentration of the first material, for example, fluorine, at the interface A1b between the first semiconductor layer A1 and the buffer layer 111, for example, the third buffer layer 111c, is increased, and the first material, for example, fluorine, fills the defects at the interface A1b between the first semiconductor layer A1 and the buffer layer 111, for example, the third buffer layer 111c, and thus the defects at the interface A1b between the first semiconductor layer A1 and the buffer layer 111, for example, the third buffer layer 111c, are decreased so that the generation of afterimages in the display apparatus may be prevented or reduced.

Referring back to FIG. 6, the buffer layer 111 may include the first buffer layer 111a, the second buffer layer 111b, and the third buffer layer 111c. In an embodiment, the first buffer layer 111a and the second buffer layer 111b may include a silicon nitride ($SiN_x$), and the third buffer layer 111c may include an inorganic insulating material such as a silicon oxide ($SiO_x$).

In an embodiment, the first buffer layer 111a and the second buffer layer 111b each may include a silicon nitride ($SiN_x$), but the composition ratios of atoms included in the first buffer layer 111a and the second buffer layer 111b may be different from each other.

Figure 8:
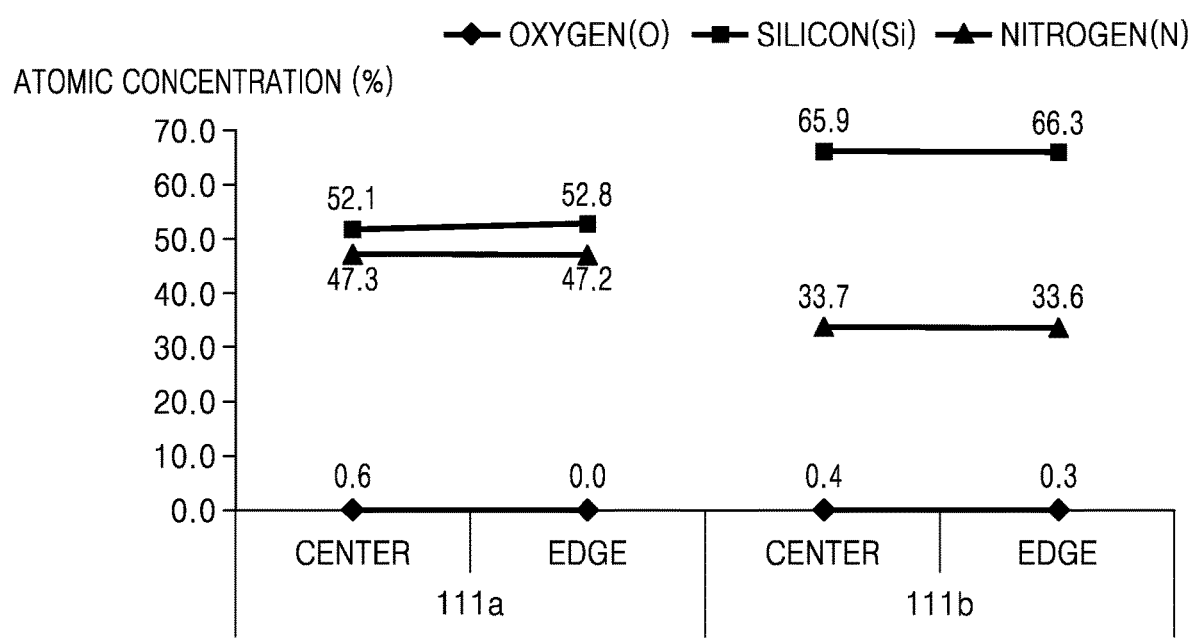
FIG. 8 is a graph of the atomic concentration of a first buffer layer and a second buffer layer of a display apparatus according to an embodiment.

FIG. 8 is a graph of the atomic concentrations of the first buffer layer 111a and the second buffer layer 111b of a display apparatus according to an embodiment. In detail, FIG. 8 is a graph of the atomic concentrations of the first buffer layer 111a and the second buffer layer 111b measured by an X-ray photoelectron spectroscopy (XPS).

Referring to FIG. 8, it may be seen that the concentration of silicon (Si) atoms included in the second buffer layer 111b may be greater than the concentration of silicon (Si) atoms included in the first buffer layer 111a. Furthermore, it may be seen that the concentration of the nitrogen (N) atoms included in the first buffer layer 111a may be greater than the concentration of the nitrogen (N) atoms included in the second buffer layer 111b.

In an embodiment, a ratio of the nitrogen (N) and the silicon (Si) included in the first buffer layer 111a may be about 0.89, and a ratio of the nitrogen (N) and the silicon (Si) included in the second buffer layer 111b may be about 0.51.

In an embodiment, the film density of the first buffer layer 111a may be greater than the film density of the second buffer layer 111b. For example, the first buffer layer 111a may have a film density of about 2.5 g/cm$^3$, and the second buffer layer 111b may have a film density of about 2.39 g/cm$^3$.

In an embodiment, the hydrogen concentration of the first buffer layer 111a may be greater than the hydrogen concentration of the second buffer layer 111b. In an embodiment, the hydrogen concentration of the first buffer layer 111a may be about $1.1 \times 10^{22}$ atom/cm$^3$ or more and about $2.0 \times 10^{22}$ atom/cm³ or less. Hydrogen included in the first buffer layer 111a may prevent or block the infiltration of foreign materials, moisture, or external air from thereunder. When the hydrogen concentration of the first buffer layer 111a is less than about $1.1 \times 10^{22}$ atom/cm³, the hydrogen concentration of the first buffer layer 111a is low so that the infiltration of foreign materials, moisture, or external air from thereunder is not prevented or blocked and thus the thin film transistor may be damaged. In contrast, when the hydrogen concentration of the first buffer layer 111a exceeds about $2.0 \times 10^{22}$ atom/cm³, the film density of the first buffer layer 111a is low so that the flatness of the first buffer layer 111a may be lowered. Accordingly, when the hydrogen concentration of the first buffer layer 111a is about $1.1 \times 10^{22}$ atom/cm³ or more and about $2.0 \times 10^{22}$ atom/cm³ or less, the gas emitted from the substrate may be prevented or blocked from arriving at the thin film transistor, and simultaneously, a flat upper surface may be provided.

In an embodiment, the hydrogen concentration of the second buffer layer 111b may be about $7.0 \times 10^{21}$ atom/cm³ or more and about $1.0 \times 10^{22}$ atom/cm³ or less. The second buffer layer 111b may prevent or block the hydrogen atoms from diffusing toward the first semiconductor layer A1 disposed above the buffer layer 111. When the hydrogen concentration of the second buffer layer 111b is less than about $7.0 \times 10^{21}$ atom/cm³, the hydrogen concentration of the second buffer layer 111b is low so that the infiltration of foreign materials, moisture, or external air from thereunder is not prevented or blocked and thus the thin film transistor may be damaged. In contrast, when the hydrogen concentration of the second buffer layer 111b exceeds about $1.0 \times 10^{22}$ atom/cm³, the hydrogen atoms diffuse toward (or into) the first semiconductor layer A1 and thus a threshold voltage shift may occur. For example, as the hydrogen atoms diffuse toward the first semiconductor layer A1, a threshold voltage may be shifted in a positive direction (+ direction). Accordingly, when the hydrogen concentration of the second buffer layer 111b is about $7.0 \times 10^{21}$ atom/cm³ or more and $1.0 \times 10^{22}$ atom/cm³ or less, the gas emitted from the substrate may be prevented or blocked from arriving at the thin film transistor, and simultaneously, as the hydrogen atoms diffuse toward (or into) the first semiconductor layer A1, the occurrence of a threshold voltage shift may be prevented or reduced.

In an embodiment, in order that the hydrogen concentration of the second buffer layer 111b is lower than the hydrogen concentration of the first buffer layer 111a, the material of the second buffer layer 111b used in a film forming process and the material of the first buffer layer 111a used in the film forming process may be different from each other.

In an embodiment, in order that the first buffer layer 111a has a higher hydrogen concentration than the second buffer layer 111b, a material having a relatively high hydrogen atom ratio may be used in the film forming process of the first buffer layer 111a. In contrast, in order than the second buffer layer 111b has a lower hydrogen concentration than the first buffer layer 111a, the material having a relatively high hydrogen atom ratio may not be used in the film forming process of the second buffer layer 111b. For example, ammonia ($NH_3$) may be used in the film forming process of the first buffer layer 111a, and the ammonia ($NH_3$) may not be used in the film forming process of the second buffer layer 111b Ammonia ($NH_3$) having a relatively high hydrogen atom ratio may be used in the film forming process of the first buffer layer 111a, and as the ammonia ($NH_3$) having a relatively high hydrogen atom ratio is not used in the film forming process of the second buffer layer 111b, the first buffer layer 111a may have a higher hydrogen concentration than the second buffer layer 111b.

In an embodiment, the first buffer layer 111a may be formed using at least one material of silane ($SiH_4$), nitrogen ($N_2$), and ammonia ($NH_3$), and the second buffer layer 111b may be formed using at least one material of silane ($SiH_4$) and nitrogen ($N_2$). In detail, the first buffer layer 111a may be formed using silane ($SiH_4$), nitrogen ($N_2$), and ammonia ($NH_3$), and the second buffer layer 111b may be formed using silane ($SiH_4$) and nitrogen ($N_2$). However, the materials used in the film forming process of the first buffer layer 111a and the second buffer layer 111b are not limited thereto.

The hydrogen concentration of the first buffer layer 111a may be greater than the hydrogen concentration of the second buffer layer 111b. For example, the first buffer layer 111a may be a layer having a higher hydrogen concentration than the second buffer layer 111b, and the second buffer layer 111b may be a layer having a lower hydrogen concentration than the first buffer layer 111a. In a structure in which the third buffer layer 111c including an inorganic insulating material such as a silicon oxide ($SiO_x$) is directly disposed on the first buffer layer 111a having a high hydrogen concentration, the hydrogen atoms included in the first buffer layer 111a diffuse toward the first semiconductor layer A1 so that the threshold voltage may be shifted in the positive direction (+ direction). Furthermore, in a structure in which the second buffer layer 111b having a low hydrogen concentration is directly disposed on barrier layer, for example, the second barrier layer 104, and the third buffer layer 111c is disposed on the second buffer layer 111b, the thin film transistor, and the like may be damaged due to the gas emitted from the substrate. Accordingly, the second buffer layer 111b having a lower hydrogen concentration than the first buffer layer 111a is disposed on the first buffer layer 111a having a high hydrogen concentration, the hydrogen atoms included in the first buffer layer 111a diffuse toward the first semiconductor layer A1 so that the shift of the threshold voltage in the positive direction(+ direction) may be prevented or reduced, and thus the perception of afterimages in the display apparatus may be prevented or reduced. Also, the thin film transistor, and the like may be prevented or reduced from being damaged due to the gas emitted from the substrate.

Furthermore, as the second buffer layer 111b having a lower hydrogen concentration than the first buffer layer 111a is disposed on the first buffer layer 111a having a high hydrogen concentration, and the third buffer layer 111c including an inorganic insulating material such as a silicon oxide ($SiO_x$) is disposed on the second buffer layer 111b, the damage to the thin film transistor due to the infiltration of foreign materials, moisture, or external air may be prevented or reduced, and the perception of afterimages in the display apparatus may be prevented or reduced.

Figure 9:
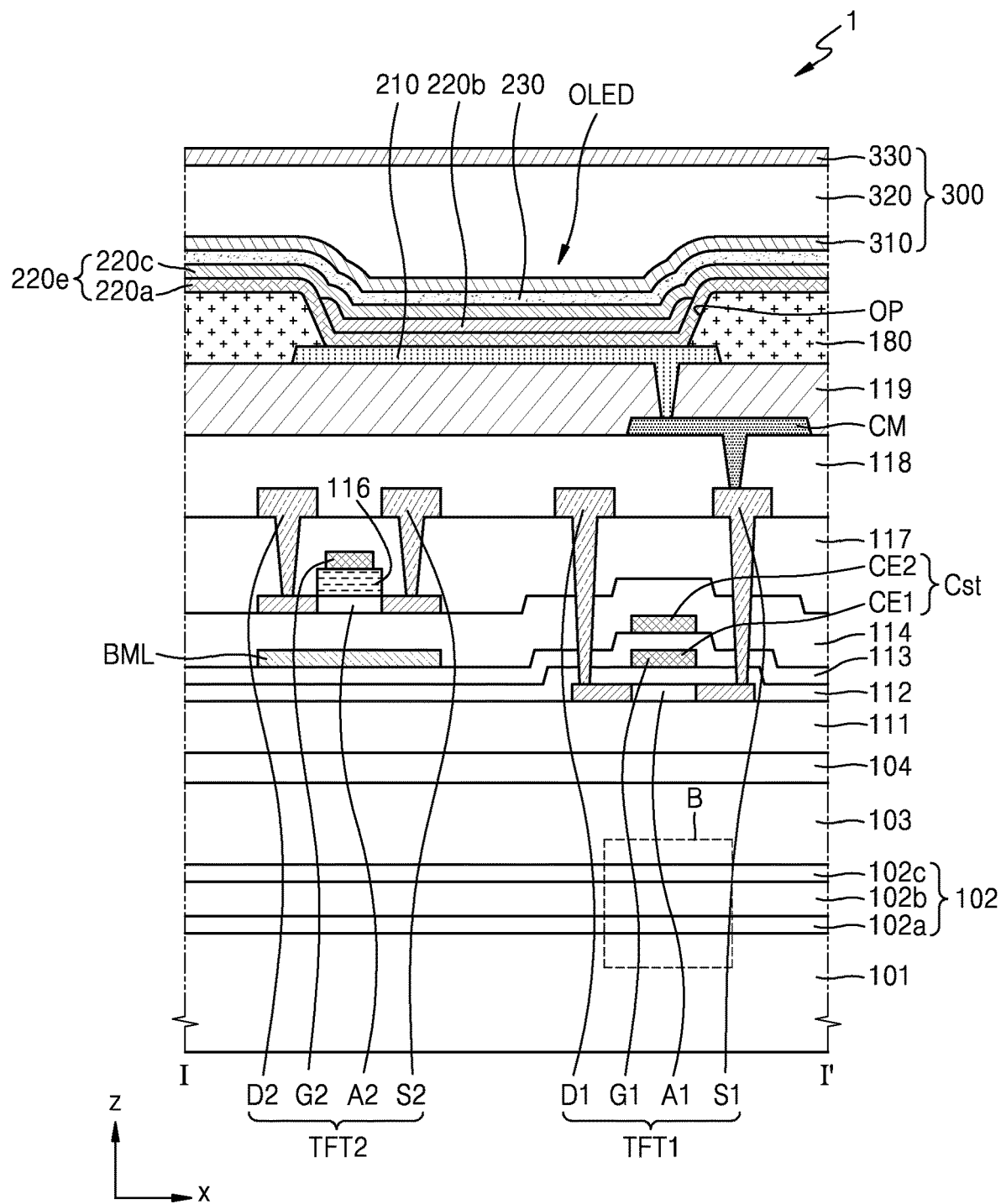
FIG. 9 is a schematic cross-sectional view of a display apparatus according to an embodiment.

FIG. 9 is a schematic cross-sectional view of a display apparatus according to an embodiment. In FIG. 9, the same reference numerals as those of FIG. 5 denote the same constituent elements, redundant descriptions thereof are omitted.

Referring to FIG. 9, the first barrier layer 102 may be disposed on the first substrate 101. The first barrier layer 102 may include a first layer 102a, a second layer 102b, and a third layer 102c, which are sequentially stacked. In an embodiment, the first layer 102a may be disposed on the first substrate 101 and the second substrate 103 may be disposed on the third layer 102c. The first barrier layer 102 is described below with reference to FIG. 10.

The second substrate 103 may be disposed on the first barrier layer 102, and the second barrier layer 104 may be disposed on the second substrate 103. Furthermore, the buffer layer 111 may be disposed on the second barrier layer 104. The first semiconductor layer A1 may be disposed on the buffer layer 111, and the first insulating layer 112 may be disposed on the first semiconductor layer A1.

Figure 10:
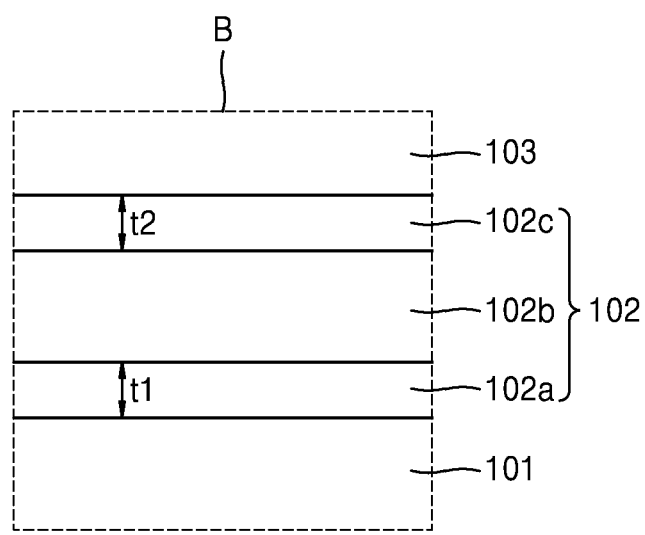
FIG. 10 is a schematic cross-sectional view of a display apparatus according to an embodiment.

FIG. 10 is a schematic cross-sectional view of a display apparatus according to an embodiment. In detail, FIG. 10 is an enlarged view of a portion B of FIG. 9.

Referring to FIG. 10, the first barrier layer 102 may be disposed on the first substrate 101. The first barrier layer 102 may include the first layer 102a, the second layer 102b, and the third layer 102c, which are sequentially stacked.

Carbon (C) included in the first substrate 101 may diffuse toward the first barrier layer 102, and accordingly, charges are trapped in an interface between the first substrate 101 and the first barrier layer 102, and thus afterimages may be perceived and the spread of the threshold voltage may be increased.

Furthermore, the carbon (C) included in the second substrate 103 diffuse toward the first barrier layer 102, and accordingly charges are trapped in an interface between the second substrate 103 and the first barrier layer 102, and thus afterimages may be perceived and the spread of the threshold voltage may be increased.

In an embodiment, the first layer 102a of the first barrier layer 102 may be a layer provided to prevent or reduce the diffusion of carbon (C) toward the first barrier layer 102 from the first substrate 101 arranged under the first barrier layer 102.

Furthermore, in an embodiment, the third layer 102c of the first barrier layer 102 may be a layer provided to prevent or reduce the diffusion of carbon (C) toward the first barrier layer 102 from the second substrate 103 arranged above the first barrier layer 102.

Figure 11:
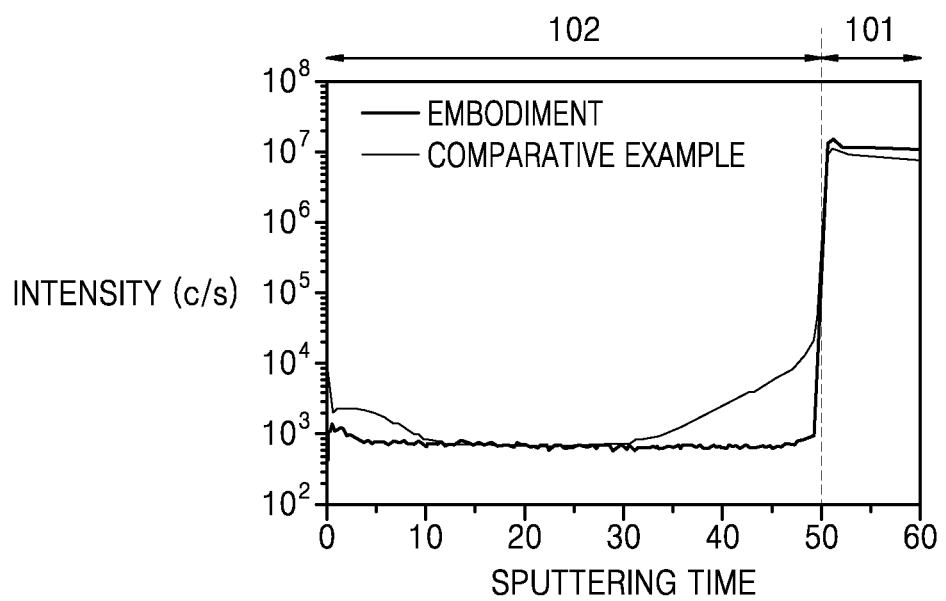
FIG. 11 is a graph of the measurement of the intensity of carbon (C) of a first barrier layer and a first substrate according to an embodiment and a comparative example.

FIG. 11 is a graph of the measurement of the intensity of the carbon (C) of the first barrier layer 102 and the first substrate 101 according to an embodiment and a comparative example. The embodiment case is that the first layer 102a of the first barrier layer 102 is directly disposed on the first substrate 101, and the comparative example case is that the second layer 102b of the first barrier layer 102 is directly disposed on the first substrate 101.

Referring to FIGS. 10 and 11, it may be seen that, compared to the case in which the second layer 102b of the first barrier layer 102 is directly disposed on the first substrate 101 (comparative example), the case in which the first layer 102a of the first barrier layer 102 is directly disposed on the first substrate 101 (embodiment) has a low intensity of the carbon (c) measured in the first barrier layer 102. Accordingly, it may be seen that the case in which the first layer 102a of the first barrier layer 102 is directly disposed on the first substrate 101 (embodiment) has a less amount of the carbon (C) diffusing from the first substrate 101 toward the first barrier layer 102, compared to the case in which the second layer 102b of the first barrier layer 102 is directly disposed on the first substrate 101 (comparative example).

Accordingly, when the first layer 102a of the first barrier layer 102 is directly disposed on the first substrate 101, the diffusion of carbon (C) from the first substrate 101 toward the first barrier layer 102 may be prevented or reduced. Furthermore, as the first layer 102a of the first barrier layer 102 prevents or reduces the diffusion of carbon (C) from the first substrate 101 toward the first barrier layer 102, the trapping of charges in the interface between the first substrate 101 and the first barrier layer 102 may be prevented or reduced. Thus, the perception of afterimages may be prevented or reduced, and the spread of the threshold voltage may be reduced.

When the third layer 102c of the first barrier layer 102 is directly disposed under the second substrate 103, the diffusion of carbon (C) from the second substrate 103 toward the first barrier layer 102 may be prevented or reduced. Furthermore, as the third layer 102c of the first barrier layer 102 prevents or reduces the diffusion of carbon (C) from the second substrate 103 toward the first barrier layer 102, the trapping of charges in the interface between the second substrate 103 and the first barrier layer 102 may be prevented or reduced. Thus, the perception of afterimages by a user may be prevented or reduced, and the spread of the threshold voltage may be reduced.

Referring back to FIG. 10, in an embodiment, the first layer 102a of the first barrier layer 102 may have a first thickness t1 in a direction perpendicular to the first substrate 101. In this state, the first thickness t1 may be about 50 Å or more and about 300 Å or less. When the first layer 102a of the first barrier layer 102 is provided with a thickness of less than about 50 Å, the diffusion of carbon (C) from the first substrate 101 to the first barrier layer 102 may be prevented. In contrast, when the thickness t1 of the first layer 102a of the first barrier layer 102 exceeds about 300 Å, the manufacturing time or manufacturing costs of the display apparatus may be increased. Accordingly, when the first layer 102a of the first barrier layer 102 is provided to have a thickness of about 50 Å or more and about 300 Å or less, the diffusion of carbon (C) from the first substrate 101 to the first barrier layer 102 may be prevented or reduced, and simultaneously, the manufacturing time or manufacturing costs of the display apparatus may be reduced.

In an embodiment, the third layer 102c of the first barrier layer 102 may have a second thickness t2 in the direction perpendicular to the first substrate 101. In this state, the second thickness t2 may be about 50 Å or more and about 300 Å or less. When the third layer 102c of the first barrier layer 102 is provided to have a thickness of less than about 50 Å, the diffusion of carbon (C) from the second substrate 103 to the first barrier layer 102 may be prevented. In contrast, when the second thickness t2 of the third layer 102c of the first barrier layer 102 exceeds about 300 Å, the manufacturing time or manufacturing costs of the display apparatus may be increased. Accordingly, when the third layer 102c of the first barrier layer 102 is provided to have a thickness of about 50 Å or more and about 300 Å or less, the diffusion of carbon (C) from the second substrate 103 to the first barrier layer 102 may be prevented or reduced, and simultaneously, the manufacturing time or manufacturing costs of the display apparatus may be reduced.

In an embodiment, the second layer 102b may be disposed between the first layer 102a and the third layer 102c. In an embodiment, the second layer 102b may have a surface roughness of about 3 nm or more and about 5 nm or less. When the surface roughness of the second layer 102b is less than about 3 nm, as the adhesion of the second layer 102b is low, the second layer 102b and the first layer 102a or the third layer 102c may be delaminated. In contrast, the surface roughness of the second layer 102b exceeds about 5 nm, afterimages may be perceived. Accordingly, when the surface roughness of the second layer 102b is provided to be about 3 nm or more and about 5 nm or less, the adhesion of the second layer 102b may be improved, and simultaneously, the perception of afterimages may be prevented or reduced.

In an embodiment, the stress of the first layer 102a and the third layer 102c may be greater than the stress of the second layer 102b. In detail, all of the first layer 102a, the second layer 102b, and the third layer 102c have compression stress, the compression stress of the first layer 102a and the third layer 102c may be greater than the compression stress of the second layer 102b.

In an embodiment, the second layer 102b is located between the first layer 102a and the third layer 102c and reduces the compression stress of the first layer 102a and the third layer 102c. In an embodiment, as the second layer 102b having a less stress than the first layer 102a and the third layer 102c is located between the first layer 102a and the third layer 102c to reduce stress, the first barrier layer 102 may be provided more stably.

In an embodiment, the hydrogen concentration of the second layer 102b may be about 1.3 times or more of the hydrogen concentration of the first layer 102a and the third layer 102c. In an embodiment, the hydrogen concentration of the first layer 102a and the third layer 102c may be about $9.8 \times 10^{20}$ atom/cm$^3$, and the hydrogen concentration of the second layer 102b may be about $1.4 \times 10^{21}$ atom/cm$^3$.

In an embodiment, to allow the first buffer layer 111a to have a higher hydrogen concentration than the second buffer layer 111b, the material having a higher hydrogen atom ratio may be used in the film forming process of the first buffer layer 111a. In contrast, in order that the second buffer layer 111b has a lower hydrogen concentration than the first buffer layer 111a, the material having a higher hydrogen atom ratio may not be used in the film forming process of the second buffer layer 111b. For example, ammonia (NH$_3$) may be used in the film forming process of the first buffer layer 111a, and ammonia (NH$_3$) may not be used in the film forming process of the second buffer layer 111b. As ammonia (NH$_3$) having a high hydrogen atom ratio may be used in the film forming process of the first buffer layer 111a, and ammonia (NH$_3$) having a high hydrogen atom ratio is not used in the film forming process of the second buffer layer 111b, the first buffer layer 111a may have a higher hydrogen concentration than the second buffer layer 111b.

In an embodiment, the first buffer layer 111a may be formed by using at least one material of silane (SiH$_4$), nitrogen (N$_2$), and ammonia (NH$_3$), and the second buffer layer 111b may be formed by using at least one material of silane (SiH$_4$) and nitrogen (N$_2$). In detail, the first buffer layer 111a may be formed by using silane (SiH$_4$), nitrogen (N$_2$), and ammonia (NH$_3$), and the second buffer layer 111b may be formed by using silane (SiH$_4$) and nitrogen (N$_2$). However, the material used in the film forming process of the first buffer layer 111a and the second buffer layer 111b is not limited thereto.

Figure 12:
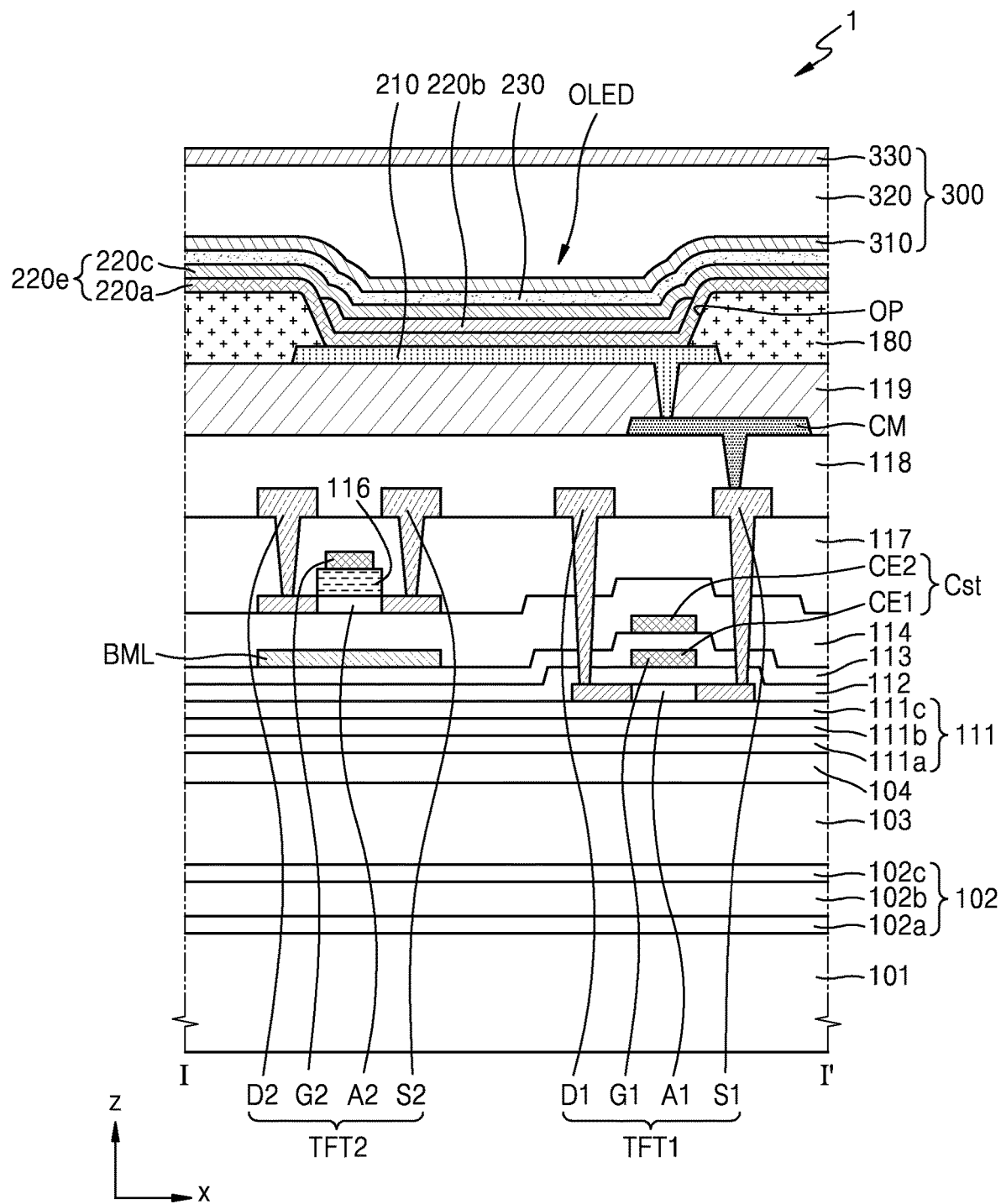
FIG. 12 is a schematic cross-sectional view of a display apparatus according to an embodiment.

FIG. 12 is a schematic cross-sectional view of a display apparatus according to an embodiment. In FIG. 12, as the same reference numerals as those of FIG. 5 or FIG. 10 denote the same constituent elements, redundant descriptions thereof are omitted.

Referring to FIG. 12, the first barrier layer 102 may be disposed on the first substrate 101. The second substrate 103 may be disposed on the first barrier layer 102. The first barrier layer 102 may include the first layer 102a, the second layer 102b, and the third layer 102c, which are sequentially stacked. The first layer 102a may be directly disposed above the first substrate 101, and the third layer 102c may be directly disposed under the second substrate 103. The first layer 102a and the third layer 102c may respectively prevent or reduce the diffusion of carbon (C) from the first substrate 101 and the second substrate 103 to the first barrier layer 102.

The second barrier layer 104 may be disposed on the second substrate 103, the buffer layer 111 may be disposed on the second barrier layer 104, and the first semiconductor layer A1 may be disposed on the buffer layer 111.

In an embodiment, the buffer layer 111 may include the first buffer layer 111a, the second buffer layer 111b, and the third buffer layer 111c. In an embodiment, the hydrogen concentration of the first buffer layer 111a may be greater than the hydrogen concentration of the second buffer layer 111b. As the first buffer layer 111a having a higher hydrogen concentration than the second buffer layer 111b is disposed under the second buffer layer 111b, the damage to the thin film transistor due to the infiltration of foreign materials, moisture, or external air from thereunder may be prevented or reduced. Furthermore, as the second buffer layer 111b having a lower hydrogen concentration than the first buffer layer 111a is disposed above the first buffer layer 111a, the diffusion of hydrogen toward the first semiconductor layer A1 may be prevented.

FIGS. 13 to 17 are schematic cross-sectional views of a method of manufacturing a display apparatus according to an embodiment.

A method of manufacturing a display apparatus is sequentially described below with reference to FIGS. 13 to 17.

Referring to FIGS. 13 to 17, a method of manufacturing a display apparatus may include forming an amorphous silicon layer 30 on the buffer layer 111, injecting a first material 40 into the amorphous silicon layer 30, forming the first semiconductor layer A1b crystallizing the amorphous silicon layer 30, into which the first material 40 is injected, into a polycrystalline silicon layer, and forming the first insulating layer 112 on the first semiconductor layer A1.

Figure 13:
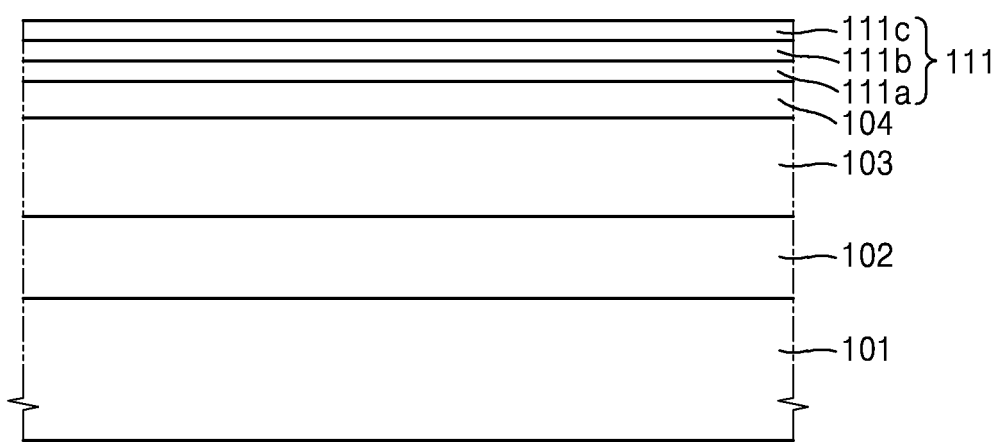
FIGS. 13, 14, 15, 16, and 17 are schematic cross-sectional views of a method of manufacturing a display apparatus, according to an embodiment.

Referring to FIG. 13, the first barrier layer 102 may be formed on the first substrate 101. In an embodiment, the first substrate 101 may include polymer resin. In an embodiment, the first substrate 101 may include polyimide. The first barrier layer 102 may include an inorganic insulating material such as a silicon oxide (SiO$_x$), a silicon nitride (SiN$_x$), a silicon oxynitride (SiO$_x$N$_y$), an aluminum oxide (Al$_2$O$_3$), a titanium oxide (TiO$_2$), a tantalum oxide (Ta$_2$O$_5$), a hafnium oxide (HfO$_2$), a zinc oxide (ZnO), and the like.

The second substrate 103 may be formed on the first barrier layer 102, and the second barrier layer 104 may be formed on the second substrate 103. In an embodiment, the second substrate 103 may include the same material as the first substrate 101. In an embodiment, the second substrate 103 may include a material different from the first substrate 101.

The buffer layer 111 may be formed on the second barrier layer 104. In an embodiment, the buffer layer 111 may include the first buffer layer 111a, the second buffer layer 111b, and the third buffer layer 111c. In an embodiment, the first buffer layer 111a, the second buffer layer 111b, and the third buffer layer 111c may be sequentially formed on the second barrier layer 104.

In an embodiment, the hydrogen concentration of the first buffer layer 111a may be greater than the hydrogen concentration of the second buffer layer 111b. In an embodiment, the hydrogen concentration of the first buffer layer 111a may be about $1.1 \times 10^{22}$ atom/cm$^3$ or more and about $2.0 \times 10^{22}$ atom/cm$^3$ or less, and the hydrogen concentration of the second buffer layer 111b may be about $7.0 \times 10^{21}$ atom/cm$^3$ or more and about $1.0 \times 10^{22}$ atom/cm$^3$ or less.

In an embodiment, a ratio of the nitrogen (N) and the silicon (Si) included in the first buffer layer 111a may be greater than a ratio of the nitrogen (N) and the silicon (Si) included in the second buffer layer 111b. In an embodiment, the ratio of the nitrogen (N) and the silicon (Si) included in the first buffer layer 111a may be about 0.7 or more, and the ratio of the nitrogen (N) and the silicon (Si) included in the second buffer layer 111b may be about 0.5 or more. In detail, the ratio of the nitrogen (N) and the silicon (Si) included in the first buffer layer 111a may be about 0.89, and the ratio of the nitrogen (N) and the silicon (Si) included in the second buffer layer 111b may be about 0.51.

In an embodiment, the film density of the first buffer layer 111a may be greater than the film density of the second buffer layer 111b. For example, the first buffer layer 111a may have a film density of about 2.5 g/cm$^3$, and the second buffer layer 111b may have a film density of about 2.39 g/cm$^3$.

Figure 14:
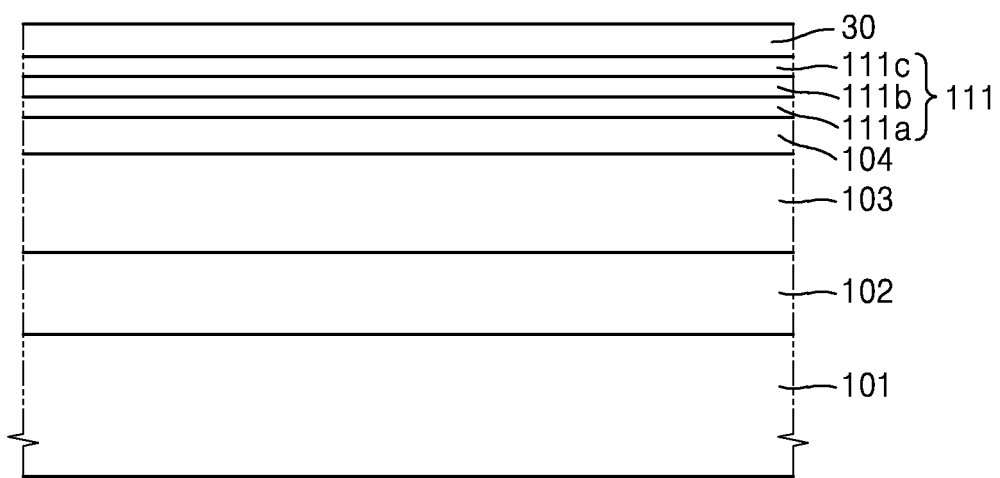

Referring to FIG. 14, the amorphous silicon layer 30 may be formed on the buffer layer 111. In an embodiment, the amorphous silicon layer 30 may be formed on the third buffer layer 111c.

Figure 15:
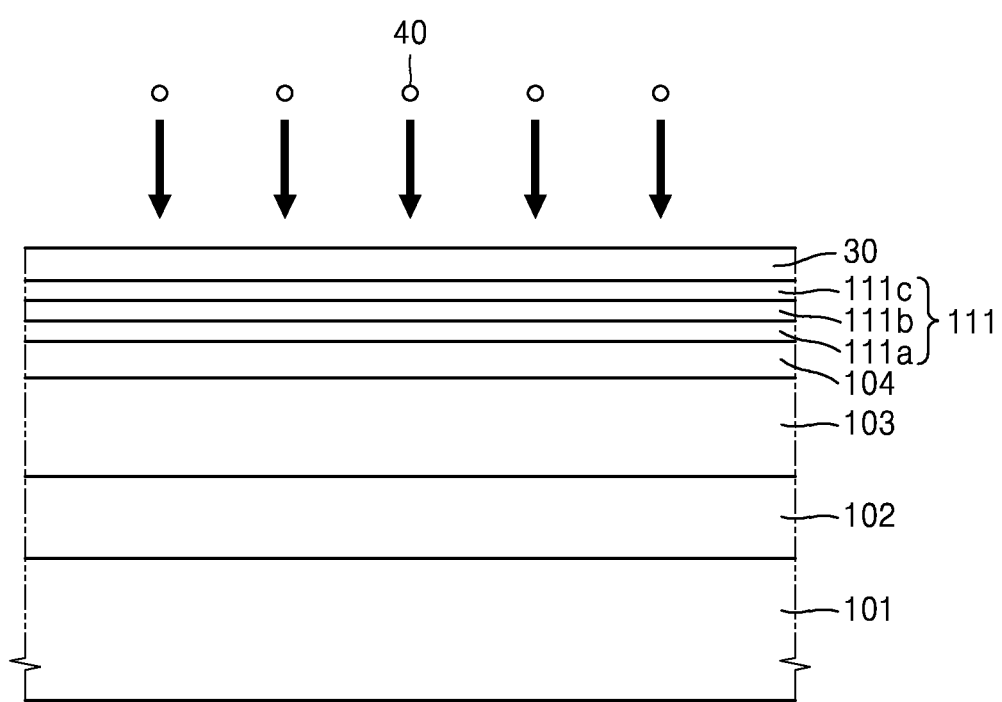

Referring to FIG. 15, after the forming of the amorphous silicon layer 30 on the buffer layer 111, injecting (doping) the first material 40 into the amorphous silicon layer 30 may be performed. In an embodiment, the first material may include fluorine, boron, arsenic, phosphorus, and the like. For example, the first material 40 that is injected (doped) into the amorphous silicon layer 30 may be fluorine.

Figure 16:
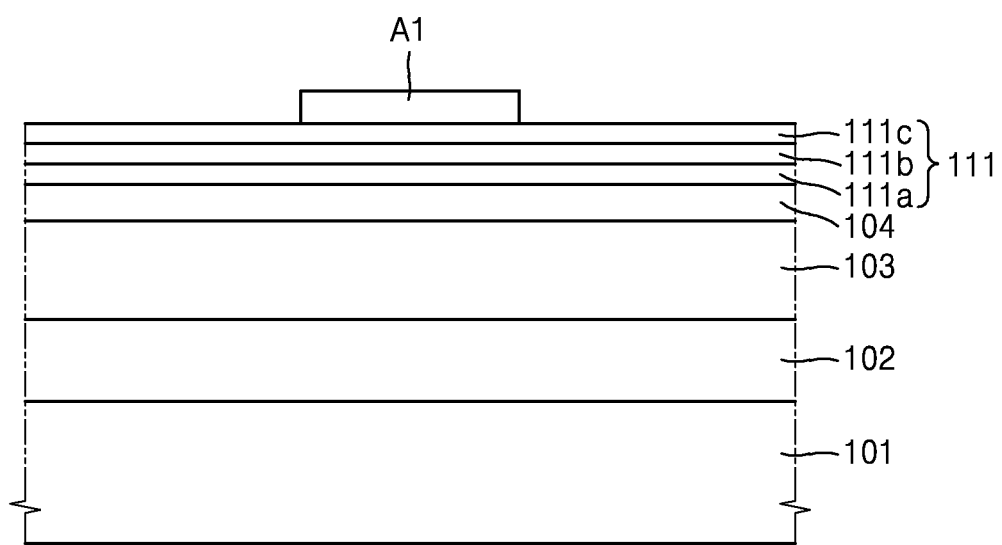

Referring to FIGS. 7 and 16, after the injecting (doping) of the first material 40, for example, fluorine, into the amorphous silicon layer 30, crystallizing the amorphous silicon layer 30, into which the first material 40, for example, fluorine, is injected (doped), into a polycrystalline silicon layer may be performed.

In an embodiment, the first semiconductor layer A1 may be formed through the crystallizing of the amorphous silicon layer 30, into which the first material 40, for example, fluorine, is injected (doped), into a polycrystalline silicon layer.

When the crystallization process is performed after the first material, for example, fluorine, is injected (doped) into the amorphous silicon layer, compared to a case in which the first material, for example, fluorine, is injected (doped) after the crystallization process is performed, the concentration of the first material, for example, fluorine, at the interface A1b between the first semiconductor layer A1 and the buffer layer 111, for example, the third buffer layer 111c, may be relatively high.

The high concentration of the first material, for example, fluorine, at the interface A1b between the first semiconductor layer A1 and the buffer layer 111, for example, the third buffer layer 111c, may mean a large amount of the first material, for example, fluorine, at the interface A1b between the first semiconductor layer A1 and the buffer layer 111, for example, the third buffer layer 111c.

As the first material, for example, fluorine, at the interface A1b between the first semiconductor layer A1 and the buffer layer 111, for example, the third buffer layer 111c, fills the defects at the interface A1b between the first semiconductor layer A1 and the buffer layer 111, for example, the third buffer layer 111c, the number of defects at the interface A1b between the first semiconductor layer A1 and the buffer layer 111, for example, the third buffer layer 111c, may be decreased.

Accordingly, as the concentration of the first material, for example, fluorine, at the interface A1b between the first semiconductor layer A1 and the buffer layer 111, for example, the third buffer layer 111c, is relatively high, the number of defects at the interface A1b between the first semiconductor layer A1 and the buffer layer 111, for example, the third buffer layer 111c, may be decreased, and thus, the generation of afterimages in the display apparatus may be prevented or reduced.

In an embodiment, when the crystallization process is performed after the first material, for example, fluorine, is injected (doped) into the amorphous silicon layer, the concentration of the first material, for example, fluorine, at the interface A1b between the first semiconductor layer A1 and the buffer layer 111, for example, the third buffer layer 111c, may be about 10% or more or about 12% or more of the concentration of the first material, for example, fluorine, at the interface A1a between the first semiconductor layer A1 and the first insulating layer 112.

In an embodiment, the minimum concentration of the first material, for example, fluorine, in the first semiconductor layer A1 may be about $1 \times 10^{20}$ atom/cm$^3$ or less. In an embodiment, the concentration of the first material, for example, fluorine, at the interface A1b between the first semiconductor layer A1 and the buffer layer 111, for example, the third buffer layer 111c, may be greater than the minimum concentration of the first material, for example, fluorine, in the first semiconductor layer A1.

In an embodiment, when the first semiconductor layer A1 is formed by injecting (doping) the first material into an amorphous silicon layer and then crystallizing the amorphous silicon layer, into which the first material, for example, fluorine, is injected (doped), into a polycrystalline silicon layer, the concentration of the first material, for example, fluorine, included in the first semiconductor layer A1, is increased, and thus the defects in the first semiconductor layer A1 are reduced so that the generation of afterimages in the display apparatus may be prevented or reduced.

In particular, as the concentration of the first material, for example, fluorine, at the interface A1b between the first semiconductor layer A1 and the buffer layer 111, for example, the third buffer layer 111c, is increased, the defects at the interface A1b between the first semiconductor layer A1 and the buffer layer 111, for example, the third buffer layer 111c, are decreased so that the generation of afterimages in the display apparatus may be prevented or reduced.

Figure 17:
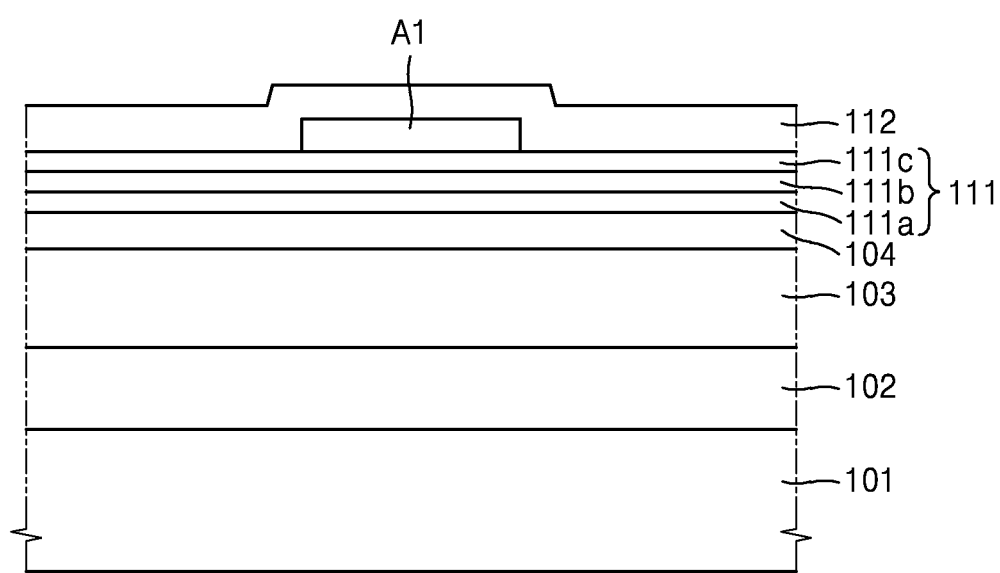

Referring to FIG. 17, forming the first insulating layer 112 on the first semiconductor layer A1 may be further performed. Furthermore, although not illustrated, the first thin film transistor TFT1 of FIG. 5, the second thin film transistor TFT2 of FIG. 5, and the organic light-emitting diode OLED of FIG. 5 may be formed on the first insulating layer 112.

Figure 18:
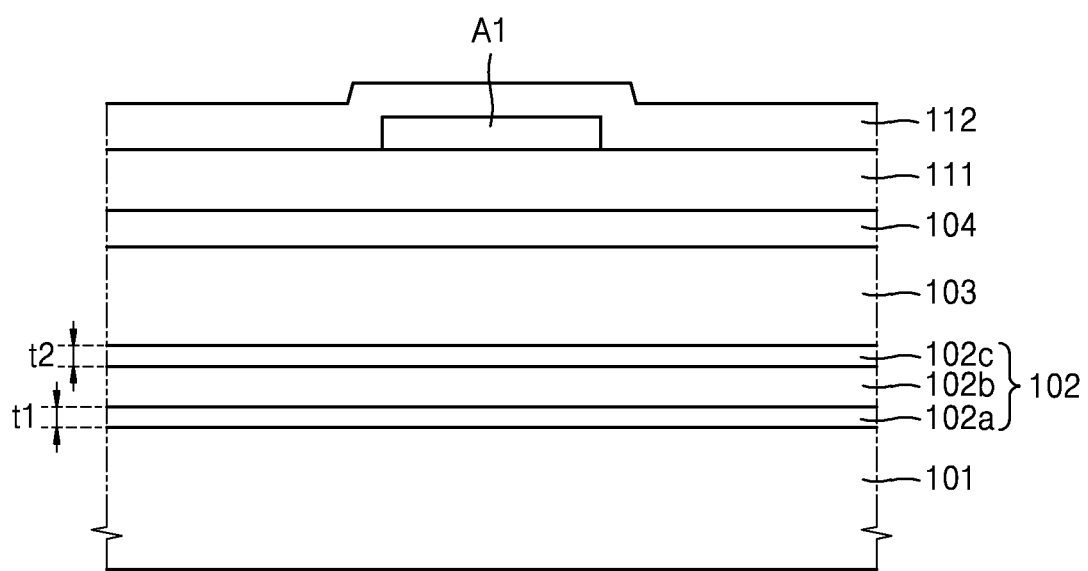
FIG. 18 is a schematic cross-sectional view of a method of manufacturing a display apparatus, according to an embodiment.

FIG. 18 is a schematic cross-sectional view of a method of manufacturing a display apparatus according to an embodiment. The embodiment of FIG. 18 is different from the method of manufacturing a display apparatus of FIGS. 13 to 17 in that the first barrier layer 102 is provided as three layers and the buffer layer 111 is provided as two layers. In FIG. 18, the same reference numerals as those of FIG. 17 denote the same constituent elements, redundant descriptions thereof are omitted.

Referring to FIG. 18, the forming of the first barrier layer 102 may be performed after the forming of the first substrate 101. In an embodiment, the first barrier layer 102 may include the first layer 102a, the second layer 102b, and the third layer 102c. In an embodiment, the first layer 102a, the second layer 102b, and the third layer 102c may be sequentially formed on the first substrate 101.

In an embodiment, the first layer 102a and the second layer 102b may be formed under conditions different from each other, and the first layer 102a and the third layer 102c may be formed under the same condition. For example, the second layer 102b may be formed by using nitrogen dioxide $NO_2$ or nitrous oxide $N_2O$ and silane ($SiH_4$) in an amount that is greater than the amount in the first layer 102a. Furthermore, the second layer 102b may be formed in the conditions of a higher pressure, a larger spacing, and a greater power than the first layer 102a. However, the disclosure is not limited thereto.

In an embodiment, the first layer 102a and the third layer 102c may have the first thickness t1 and the second thickness t2, respectively. In this state, the first thickness t1 and the second thickness t2 may be about 50 Å or more and about 300 Å or less. As the first layer 102a and the third layer 102c each have a thickness of about 50 Å or more and about 300 Å or less, the diffusion of carbon (C) toward the first barrier layer 102 in the substrate 101 and 103 may be prevented or reduced, and simultaneously, the manufacturing time or manufacturing costs of the display apparatus may be reduced.

In an embodiment, the second layer 102b may have a surface roughness of about 3 nm or more and about 5 nm or less. As the surface roughness of the second layer 102b is about 3 nm or more and about 5 nm or less, the adhesion of the second layer 102b may be improved, and simultaneously, the perception of afterimages may be prevented or reduced.

In an embodiment, the stress of the first layer 102a and the third layer 102c may be greater than the stress of the second layer 102b. In detail, while all of the first layer 102a, the second layer 102b, and the third layer 102c may have compression stress, the compression stress of the first layer 102a and the third layer 102c may be greater than the compression stress of the second layer 102b. In an embodiment, the second layer 102b is located between the first layer 102a and the third layer 102c and reduces the compression stress of the first layer 102a and the third layer 102c.

In an embodiment, the hydrogen concentration of the second layer 102b may be about 1.3 times or more of the hydrogen concentration of the first layer 102a and the third layer 102c. In an embodiment, the hydrogen concentration of the first layer 102a and the third layer 102c may be about $9.8 \times 10^{20}$ atom/cm³, and the hydrogen concentration of the second layer 102b may be about $1.4 \times 10^{21}$ atom/cm³.

Next, the second substrate 103 may be formed on the first barrier layer, the second barrier layer 104 may be formed on the second substrate 103, and the buffer layer 111 may be formed on the second barrier layer 104. The buffer layer 111 may include a first buffer layer including a silicon nitride ($SiN_x$) and a second buffer layer including an inorganic insulating material such as a silicon oxide ($SiO_x$).

Figure 19:
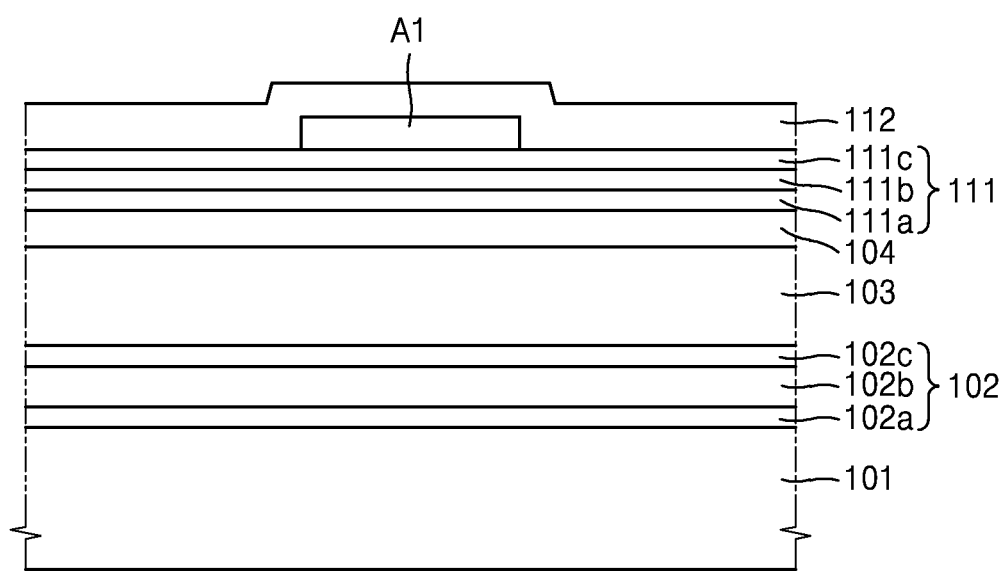
FIG. 19 is a schematic cross-sectional view of a method of manufacturing a display apparatus according to an embodiment.

FIG. 19 is a schematic cross-sectional view of a method of manufacturing a display apparatus according to an embodiment. The embodiment of FIG. 19 is different from the embodiment of FIG. 18 in that the buffer layer 111 includes three layers. In FIG. 19, the same reference numerals as those of FIG. 18 denote the same constituent elements, redundant descriptions thereof are omitted.

Referring to FIG. 19, in an embodiment, the first barrier layer 102 may include the first layer 102a, the second layer 102b, and the third layer 102c. In an embodiment, the first layer 102a, the second layer 102b, and the third layer 102c may be sequentially formed on the first substrate 101. In an embodiment, the first layer 102a may directly contact the first substrate 101, and the third layer 102c may directly contact the second substrate 103. The first layer 102a and the third layer 102c may respectively prevent or reduce the diffusion of carbon (C) from the first substrate 101 and the second substrate 103 to the first barrier layer 102.

In an embodiment, the buffer layer 111 may be formed on the second barrier layer 104. In an embodiment, the buffer layer 111 may include the first buffer layer 111a, the second buffer layer 111b, and the third buffer layer 111c. In an embodiment, the first buffer layer 111a, the second buffer layer 111b, and the third buffer layer 111c may be sequentially formed on the second barrier layer 104.

In an embodiment, the buffer layer 111 may include the first buffer layer 111a, the second buffer layer 111b, and the third buffer layer 111c. In an embodiment, the hydrogen concentration of the first buffer layer 111a may be greater than the hydrogen concentration of the second buffer layer 111b. As the first buffer layer 111a having a higher hydrogen concentration than the second buffer layer 111b is formed under the second buffer layer 111b, the damage to the thin film transistor due to the infiltration of foreign materials, moisture, or external air from thereunder may be prevented or reduced. Furthermore, as the second buffer layer 111b having a lower hydrogen concentration than the first buffer layer 111a is formed above the first buffer layer 111a, the diffusion of hydrogen toward the first semiconductor layer A1 may be prevented.

According to the above-described embodiments, as the fluorine concentration at the interface between the semiconductor layer and the barrier layer is increased, the perception of afterimages may be prevented or reduced, and simultaneously, a display apparatus having improved reliability, and a method of manufacturing the display apparatus, may be implemented. The scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate;
   a buffer layer on the substrate;
   a thin film transistor comprising a semiconductor layer disposed on the buffer layer and comprising a silicon semiconductor, and a gate electrode insulated from the semiconductor layer; and
   an insulating layer covering the semiconductor layer,
   wherein a concentration of fluorine at an interface between the semiconductor layer and the buffer layer is at least 10% of a concentration of the fluorine at the interface between the semiconductor layer and the insulating layer.

2. The display apparatus of claim 1, wherein a minimum concentration of the fluorine in the first semiconductor layer is no more than $1 \times 10^{20}$ atom/cm³.

3. The display apparatus of claim 2, wherein a concentration of the fluorine at the interface between the semiconductor layer and the buffer layer is greater than a minimum concentration of the fluorine of the semiconductor layer.

4. The display apparatus of claim 1, wherein the buffer layer comprises a first buffer layer on the substrate, a second buffer layer on the first buffer layer, and a third buffer layer on the second buffer layer, and
a hydrogen concentration of the first buffer layer is greater than a hydrogen concentration of the second buffer layer.

5. The display apparatus of claim 4, wherein a hydrogen concentration of the first buffer layer is within the range and including $1.1 \times 10^{22}$ atom/cm$^3$ to $2.0 \times 10^{22}$ atom/cm$^3$, and a hydrogen concentration of the second buffer layer is within the range and including $7.0 \times 10^{21}$ atom/cm$^3$ to $1.0 \times 10^{22}$ atom/cm$^3$.

6. The display apparatus of claim 4, wherein a film density of the first buffer layer is greater than a film density of the second buffer layer.

7. The display apparatus of claim 4, further comprising a barrier layer disposed between the substrate and the buffer layer and comprising a first layer on the substrate, a second layer on the first layer, and a third layer on the second layer.

8. The display apparatus of claim 7, wherein the second layer has a surface roughness within the range and including 3 nm to 5 nm.

9. The display apparatus of claim 7, wherein a hydrogen concentration of the second layer is greater than a hydrogen concentration of the first layer.

10. The display apparatus of claim 9, wherein the first layer has a first thickness in a direction perpendicular to the substrate, and the third layer has a second thickness in a direction perpendicular to the substrate.

11. The display apparatus of claim 10, wherein the first thickness and the second thickness each are within the range and including 50 Å to 300 Å.

12. The display apparatus of claim 1, further comprising:
a second insulating layer covering the gate electrode; and
a second thin film transistor disposed on the second insulating layer and comprising a second semiconductor layer including an oxide semiconductor and a second gate electrode insulated from the second semiconductor layer.

13. The display apparatus of claim 12, wherein the gate electrode and the second gate electrode are arranged on layers different from each other.

* * * * *